(12) United States Patent
Ivanov et al.

(10) Patent No.: US 8,507,704 B2
(45) Date of Patent: *Aug. 13, 2013

(54) LIQUID COMPOSITION CONTAINING AMINOETHER FOR DEPOSITION OF METAL-CONTAINING FILMS

(75) Inventors: Sergei Vladimirovich Ivanov, Schnecksville, PA (US); Xinjian Lei, Vista, CA (US); Daniel P. Spence, Carlsbad, CA (US); John Anthony Thomas Norman, Encinitas, CA (US); Laura M. Matz, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 109 days.

This patent is subject to a terminal disclaimer.

(21) Appl. No.: 12/871,284

(22) Filed: Aug. 30, 2010

(65) Prior Publication Data

US 2011/0212629 A1   Sep. 1, 2011

Related U.S. Application Data

(60) Provisional application No. 61/240,359, filed on Sep. 8, 2009, provisional application No. 61/240,436, filed on Sep. 8, 2009.

(51) Int. Cl.

| C07F 5/00 | (2006.01) |
|---|---|
| C07F 5/06 | (2006.01) |
| C07F 9/00 | (2006.01) |
| C07F 13/00 | (2006.01) |
| C07F 7/00 | (2006.01) |
| C07F 11/00 | (2006.01) |
| C07F 1/00 | (2006.01) |
| C07F 3/00 | (2006.01) |
| C07F 15/00 | (2006.01) |
| C07C 49/92 | (2006.01) |

(52) U.S. Cl.
USPC ........ 556/1; 556/27; 556/40; 556/42; 556/45; 556/51; 556/57; 556/64; 556/113; 556/118; 556/137; 556/138

(58) Field of Classification Search
USPC .............................................. 556/1, 51, 137
See application file for complete search history.

(56) References Cited

U.S. PATENT DOCUMENTS

| 3,330,782 A | 7/1967 | Poppelsdorf |
| 3,426,072 A | 2/1969 | Warner |
| 4,408,075 A | 10/1983 | Soula et al. |
| 4,556,546 A * | 12/1985 | Burgoyne et al. ............. 423/226 |
| 5,204,314 A | 4/1993 | Kirlin et al. |
| 5,225,561 A | 7/1993 | Kirlin et al. |
| 5,280,012 A | 1/1994 | Kirlin et al. |
| 5,337,651 A | 8/1994 | Gardiner et al. |
| 5,453,494 A | 9/1995 | Kirlin et al. |
| 5,717,051 A | 2/1998 | Hiraoka et al. |
| 5,820,664 A | 10/1998 | Gardiner et al. |
| 5,858,541 A | 1/1999 | Hiraoka et al. |
| 5,900,279 A | 5/1999 | Hideaki et al. |
| 5,916,359 A | 6/1999 | Baum et al. |
| 5,919,522 A | 7/1999 | Baum et al. |
| 6,225,237 B1 | 5/2001 | Vaartstra |
| 6,277,436 B1 | 8/2001 | Stauf et al. |
| 6,340,386 B1 | 1/2002 | Hendrix et al. |
| 6,399,208 B1 | 6/2002 | Baum et al. |
| 6,576,794 B2 | 6/2003 | Fukushima et al. |
| 6,596,888 B2 | 7/2003 | McElwee-White et al. |
| 6,623,656 B2 | 9/2003 | Baum et al. |
| 6,660,331 B2 | 12/2003 | Hendrix et al. |
| 6,984,591 B1 | 1/2006 | Buchanan et al. |
| 7,034,169 B1 | 4/2006 | Norman |
| 7,094,284 B2 | 8/2006 | Baum et al. |
| 7,105,662 B2 | 9/2006 | Henningsen et al. |
| 7,323,581 B1 | 1/2008 | Gardiner et al. |
| 7,393,982 B2 | 7/2008 | Saito et al. |
| 7,495,131 B2 | 2/2009 | Burdeniuc et al. |
| 7,947,814 B2 * | 5/2011 | Lei et al. ................... 534/15 |
| 2002/0015790 A1 | 2/2002 | Baum et al. |

(Continued)

FOREIGN PATENT DOCUMENTS

| GB | 1154518 | 6/1969 |
| JP | 01-070447 | 3/1989 |

(Continued)

OTHER PUBLICATIONS

Ciampolini, M. et al. "Complexes of bivalent iron, cobalt, nickel, and copper with bis(2-dimethylaminoethyl) oxide," Inorg. Chem. (1967) 6: 445-449.*

H.C. Aspinall, et al, Growth of Lanthanum Silicate Thin Films by Liquid Injection MOCVD Using Tris[bis(trimethylsilyl)amido]lanthanum, Chemical Vapor Deposition, 2003, 7.

V. Galindo, et al, High quality YBa2Cu3O7 multilayers grown by pulsed injection MOCVD, Journal of Crystal Growth, 2000, 357-364.

J. Gatineau, et al, High purity ruthenium thin films depositions using a RuO4 solvent solution, Advanced Metallization Conference, 2005, Colorado Springs, CO and Tokyo, Japan, 475-480.

(Continued)

*Primary Examiner* — Johann Richter
*Assistant Examiner* — Kofi Adzamli
(74) *Attorney, Agent, or Firm* — Lina Yang

(57) ABSTRACT

A formulation, comprising: a) at least one metal-ligand complex, wherein one or more ligands are selected from the group consisting of β-diketonates, β-ketoiminates, β-ketoesterates, β-diiminates, alkyls, carbonyls, alkyl carbonyls, cyclopentadienyls, pyrrolyls, alkoxides, amidinates, imidazolyls, and mixtures thereof; and the metal is selected from Group 2 to 16 elements of the Periodic Table of the Elements; and, b) at least one aminoether selected from the group consisting of $R^1R^2NR^3OR^4NR^5R^6$, $R^1OR^4NR^5R^6$, $O(CH_2CH_2)_2NR^1$, $R^1R^2NR^3N(CH_2CH_2)_2O$, $R^1R^2NR^3OR^4N(CH_2CH_2)_2O$, $O(CH_2CH_2)_2NR^1OR^2N(CH_2CH_2)_2O$, and mixtures thereof, wherein $R^{1-6}$ are independently selected from group consisting of $C_{1-10}$ linear alkyl, $C_{1-10}$ branched alkyl, $C_{1-10}$ cyclic alkyl, $C_6$-$C_{10}$ aromatic, $C_{1-10}$ alkylamine, $C_{1-10}$ alkylaminoalkyl, $C_{1-10}$ ether, $C_4$-$C_{10}$ cyclic ether, $C_4$-$C_{10}$ cyclic aminoether, and mixture thereof.

14 Claims, 8 Drawing Sheets

(56) References Cited

U.S. PATENT DOCUMENTS

| | | | |
|---|---|---|---|
| 2002/0156325 A1* | 10/2002 | Chang et al. | 564/502 |
| 2003/0180451 A1 | 9/2003 | Kodas et al. | |
| 2004/0215030 A1 | 10/2004 | Norman | |
| 2007/0248754 A1* | 10/2007 | Lei et al. | 427/248.1 |
| 2010/0075067 A1* | 3/2010 | Kim et al. | 427/576 |
| 2010/0143607 A1* | 6/2010 | Lei et al. | 427/569 |

FOREIGN PATENT DOCUMENTS

| | | |
|---|---|---|
| JP | 5132776 | 5/1993 |
| JP | 6234779 | 8/1994 |
| JP | 11-269656 | 10/1999 |
| JP | 2001-049434 | 2/2001 |
| JP | 2003201563 | 7/2003 |
| JP | 2004079815 | 3/2004 |
| JP | 2005-002099 | 1/2005 |
| WO | 0218394 | 3/2002 |

OTHER PUBLICATIONS

T. Kawahara, et al, Conformal step coverage of (Ba, Sr)TiO3 films prepared by liquid source CVD using Ti(t-BuO) (2)(DPM)(2), Japanese Journal of Applied Physics, 1999, 2205-2209.

D.J. Lee, et al, Chemical vapor deposition of ruthenium oxide thin films from Ru(tmhd)3 using direct liquid injection, Thin Solid Films, 2001, 237.

V. Moshnyaga, et al, Preparation of rare-earth manganite-oxide thin films by metalorganic aerosol deposition techinque, Applied Physics Letters, 1999, 2842-2844.

A. Porporati, et al, Metallorganic chemical vapor deposition of Ta2O5 films, Journal of the European Ceramic Society, 2003, 247-252.

I.M. Watson, et al, Investigations of Barium Beta-Diketonate Complexes Used in Chemical Vapor Deposition of High-T-C Oxide-Films Superconductor Science & Technology, 1994, 672-680.

F. Weiss, et al, Preparation of YBa2Cu3O7 Films by Low-Pressure MOCVD Using Liquid Solution Sources, Journal De Physique, 1993, 321-328.

P.A. Williams, et al, The Unusual Thermal Stabilization of MOCVD Precursors by the Dibenzoyl Methanate Group: Liquid Injection MOCVD of Tantalum Oxide and Niobium Oxide Using M(OEt)4(dbm) Precursors, Chemical Vapor Deposition, 2002, 110.

C.F. Xia, et al, Fabrication of Ag/Y2O3-stabilized ZrO2 composite films by metalorganic chemical vapor deposition, Journal of the Electrochemical Society, 1998, L4-L8.

F.C. Yuan, et al, Preparation of YBCO/Ag superconducting tapes with a high current-carrying capacity by MOCVD using a single solution source from a supersonic atomizer, Superconductor Science & Technology, 1996, 991-993.

* cited by examiner

LIQUID COMPOSITION CONTAINING AMINOETHER FOR DEPOSITION OF METAL-CONTAINING FILMS

CROSS REFERENCE TO RELATED APPLICATIONS

The present patent application claims the benefit of U.S. Provisional Patent Applications Ser. Nos. 61/240,359 filed Sep. 8, 2009 and 61/240,436 filed Sep. 8, 2009.

BACKGROUND OF THE INVENTION

This invention relates to a solvent composition useful for liquid delivery of metal precursors in chemical vapor deposition (CVD) or atomic layer deposition (ALD).

Chemical vapor deposition methods are often used in semiconductor industry to deposit thin films of various materials on a selected substrate. In a traditional chemical vapor deposition (CVD) the vapor of one or more volatile precursors is contacted in chemical vapor deposition reactor with a solid substrate, which has been pre-heated to the temperature above thermal decomposition of at least one of the precursors. For deposition of highly conformal films on complex surfaces, such as deep trenches and other stepped structures, cyclic chemical vapor deposition methods are often used. For example, in an atomic layer deposition (ALD) method, a pulse of one precursor is separated from a pulse of second precursor by a pulse of inert gas. In this case, separate dosing of volatile precursors prevents gas-phase reactions between highly reactive precursors and promotes highly selective surface reactions. ALD is now considered as one deposition method with the greatest potential for producing very thin, conformal films of high K dielectric metal oxides.

While a number of vapor deposition techniques are described in the literature for deposition of many materials including silicon, silicon dioxide, aluminum oxide, titanium nitride, consistent delivery of precursor vapors to the deposition reactor is still quite challenging for deposition of films containing: titanium, zirconium, strontium, barium, lanthanides and a number of other transition metals. This is mainly due to lack of thermally stable liquid precursors, with relatively high vapor pressure for vapor phase delivery. In many cases, the precursors are solids, whose sublimation temperature is very close to the precursor's decomposition temperature.

A number of precursor delivery systems have been designed to address these challenges. One method, which is already widely used in semiconductor industry for delivery of metal organic precursors, is based on conventional bubbler technology, where inert gas is bubbled through a neat liquid or a molten precursor at elevated temperature. However, this method has several disadvantages. First of all, precise temperature control of the bubbler is required during the single run and between different runs to maintain constant delivery rate of the precursor. A number of precursors have very low vapor pressure at moderate temperatures and have to be heated to 100-200° C. to deliver enough precursor vapors to the deposition reactor by the bubbling method. However, extended periods of time at these temperatures may cause thermal decomposition of the precursors. The precursors may also react with traces of moisture and oxygen introduced to the bubbler during multiple deposition cycles. The examples of precursors with limited thermal stability and/or high reactivity toward moisture include metal alkylamides, metal alkoxides, metal cyclopentadienyls, metal ketoiminates and others. Products of thermal decomposition may plug delivery lines and affect the delivery rate of precursors. Solid precursors delivered from their molten phase may also plug the lines during multiple cooling/heating cycles.

An alternative delivery technique, direct liquid injection (DLI), has several advantages for precursor delivery, including the ability to deliver higher flux of precursor vapors to the chamber, stable operation over reasonable lifetimes, gentle thermal transfer to precursors, and ease of integration with existing commercial deposition chambers. In this method, a liquid precursor or a solution of a precursor and solvent is delivered to a heated vaporization system, whereby the liquid composition is transferred from the liquid phase to the gas phase. Advanced liquid metering of the precursor to the vaporizer provides accurate, stable control of precursor delivery rate. It is critical during the vaporization process that the precursor structure is maintained and decomposition is eliminated. Historically, neat liquid precursors were delivered through DLI. With a suitable solvent, implementation of DLI allows delivery of a wide variety of metalorganic precursors, including solids and highly viscous liquids, which may not be suitable for vapor delivery by the bubbling method.

A number of solvents have been proposed for DLI of metalorganic precursors in prior art, for example: alkanes, glymes and polyamines, for delivery of metal organic precursors.

The prior art generally discloses solvents that can be used in combination with metalorganic precursors, but they do not call out specific benefit regarding the solubility requirements and the thermal requirements.

However, there is still a continued need for developing improved compositions for DLI of highly viscous or solid metalorganic precursors with low vapor pressure.

Prior art in the general field of the Present Invention includes the following references.

Aspinall, H. C., P. A. Williams, J. Gaskell, A. C. Jones, J. L. Roberts, L. M. Smith, P. R. Chalker and G. W. Critchlow (2003). "Growth of Lanthanum Silicate Thin Films by Liquid Injection MOCVD Using Tris[bis(trimethylsilyl)amido]lanthanum", Chemical Vapor Deposition 9: p 7.

Baum, T. H. and G. Bhandari (1999). "Alkane and polyamine solvent compositions for liquid delivery chemical vapor deposition", U.S. Pat. No. 5,916,359.

Baum, T. H., J. F. Roeder, C. Xu and B. C. Hendrix (2002). "Source reagent compositions for CVD formation of high dielectric constant and ferroelectric metal oxide thin films and method of using same", US2002/015790.

Baum, T. H., G. T. Stauf, P. S. Kirlin, D. W. Brown, R. A. Gardiner, G. Bhandari and B. A. Vaartstra (1996). "Growth of $BaSrTiO_3$ using polyamine-based precursors", U.S. Pat. No. 5,919,522.

Buchanan, D. A. and D. A. Neumayer (2006). "Precursor source mixtures", U.S. Pat. No. 6,984,591.

Burdeniuc, J. J. and A. Z. Kamzelski (2005). "Blowing catalyst compositions containing hydroxyl and surface active groups for the production of polyurethane foams", U.S. Pat. No. 7,495,131.

Fukushima, T., H. Masuda, U. Nishimoto and H. Abe (2001). "Process for production of ether amine", U.S. Pat. No. 6,576,794.

Galindo, V., J. P. Senateur, A. Abrutis, A. Teiserskis and F. Weiss (2000). "High quality $YBa_2Cu_3O_7$ and $PrBa_2Cu_3O_7$ multilayers grown by pulsed injection MOCVD", Journal of Crystal Growth 208(1-4): pp 357-364.

Gardiner, R. A., T. H. Baum, I. r. C. L. Gordon, T. E. Glassman, S. Pombrik, B. A. Vaastra, P. S. Kirlin and d. D. C. Gordon (2008). "Source reagent compositions and method for forming metal films on a substrate by chemical vapor deposition", U.S. Pat. No. 7,323,581.

Gardiner, R. A. and P. S. Kirlin (1994). "Apparatus and method for protection of pumps used for delivery of air- or moisture-sensitive liquids", U.S. Pat. No. 5,337,651.

Gardiner, R. A., P. S. Kirlin, T. H. Baum, D. Gordon, T. E. Glassman, S. Pombrik and B. A. Vaartstra (1998). "Precursor compositions for chemical vapor deposition, and ligand exchange resistant metal-organic precursor solutions comprising same", U.S. Pat. No. 5,820,664.

Gardiner, R. A., P. S. Kirlin, T. H. Baum, D. Gordon, T. E. Glassman, S. Pombrik and B. A. Vaartstra (2002). "Preparation of source reagent compositions and method for forming metal films on a substrate by chemical vapor deposition." WO 2002/18394.

Gatineau, J., K. Yanagita and C. Dussarrat (2006). "High purity ruthenium thin films depositions using a $RuO_4$ solvent solution", Advanced Metallization Conference 2005, Proceedings of the Conference, Colorado Springs, Colo., United States, September 27-29, and Tokyo, Japan, Oct. 13-14, 2005: pp 475-480.

Hendrix, B. C., T. H. Baum, D. D. Christos and J. F. Roeder (2002). "MOCVD of bismuth strontium tantalate using toluene based solvent system for precursor delivery", U.S. Pat. No. 6,340,386.

Hendrix, B. C., T. H. Baum, D. D. Christos and J. F. Roeder (2002). "MOCVD of bismuth strontium tantalate using toluene based solvent system for precursor delivery", U.S. Pat. No. 6,660,331.

Henningsen, M., A. Kusche, M. Hüllmann, L. Rüb, S. Käshammer and T. Gerlach (2003). "Method of producing N-substituted 2,6-dialkylmorpholines", U.S. Pat. No. 7,105,662.

Hideaki, M., N. Masakazu, M. Kurihara, H. Kokubun, M. Shigyo and S. Hiroshi (1999). "Processes for the chemical vapor deposition and solvent used for the processes", U.S. Pat. No. 5,900,279.

Hiraoka, T., Y. Majima, K. Todori, J. R. Koe, Y. Nakano, S. Murai and S. Hayase (1998). "Glass composite material, precursor thereof, nitrogen-containing composite material and optical device", U.S. Pat. No. 5,717,051.

Hiraoka, T., Y. Majima, K. Todori, J. R. Koe, Y. Nakano, S. Murai and S. Hayase (1999). "Glass composite material, precursor thereof, nitrogen-containing composite material and optical device ", U.S. Pat. No. 5,858,541.

Itsuki, A. and K. Ogi (2003). "Copper(II) b-diketonate solutions for metalorganic chemical vapor deposition (MOCVD) and copper thin films obtained by MOCVD", JP2003/201563.

Kawahara, T., S. Matsuno, M. Yamamuka, M. Tarutani, T. Sato, T. Horikawa, F. Uchikawa and K. Ono (1999). "Conformal step coverage of (Ba,Sr)TiO3 films prepared by liquid source CVD using Ti(t-BuO)(2)(DPM)(2)", Japanese Journal of Applied Physics Part 1-Regular Papers Short Notes & Review Papers 38(4B): pp 2205-2209.

Kirlin, P. S., R. L. Binder and R. A. Gardiner (1993). "Method for delivering an involatile reagent in vapor form to a CVD reactor", U.S. Pat. No. 5,204,314.

Kirlin, P. S., D. W. Brown and R. A. Gardiner (1993). "Source reagent compounds for MOCVD of refractory films containing group IIA elements", U.S. Pat. No. 5,225,561.

Kirlin, P. S., D. W. Brown and R. A. Gardiner (1994). "Source reagent compounds for MOCVD of refractory films containing group IIA elements", U.S. Pat. No. 5,280,012.

Kirlin, P. S., D. W. Brown and R. A. Gardiner (1995). "Metal complex source reagents for MOCVD", U.S. Pat. No. 5,453,494.

Kobayashi, K., T. Nakai and Y. Sugimori (1993). "Organometallic complexes for chemical vapor deposition and solutions thereof", JP5132776.

Kobayashi, K. and Y. Sugimori (1994). "Preparation of tin b-diketonate solution", JP6234779.

Kodas, T. T., M. J. Hampden-Smith, K. Vanheusden, H. Denham, A. D. Stump, A. B. Schult, P. Atanassova and K. Kunze (2005). "Low viscosity copper precursor compositions and methods for the deposition of conductive electronic features", US2003/0180451.

Lee, D.-J., S.-W. Kang and S.-W. Rhee (2001). "Chemical vapor deposition of ruthenium oxide thin films from Ru(t-mhd)3 using direct liquid injection", Thin Solid Films 413: p 237.

McElwee-White, L., T. J. Anderson, S. W. Johnston, C. G. Ortiz and O. J. Bchir (2002). "MOCVD of WNx thin films using imido precursors", U.S. Pat. No. 6,596,888.

Moshnyaga, V., I. Khoroshun, A. Sidorenko, P. Petrenko, A. Weidinger, M. Zeitler, B. Rauschenbach, R. Tidecks and K. Samwer (1999). "Preparation of rare-earth manganite-oxide thin films by metalorganic aerosol deposition technique", Applied Physics Letters 74(19): pp 2842-2844.

Poppelsdorf, F. (1967). "beta -(N,N-Dimethylamino)alkyl ethers as catalysts for isocyanate reactions", U.S. Pat. No. 3,330,782.

Porporati, A., S. Roitti and O. Sbaizero (2003). "Metallorganic chemical vapor deposition of Ta2O5 films", Journal of the European Ceramic Society 23(2): pp 247-251.

Saito, M., T. Ueda, T. Tani and K. Nakamura (2004). "Processes for preparation of b-diketone compound, metal complex thereof and metallic compound", U.S. Pat. No. 7,393,982.

Soula, G. and L. Linguenheld (1980). "Process for the preparation of tris-(ether-amines) and the tris-(ether-amines) produced", U.S. Pat. No. 4,408,075.

Stauf, G. T., J. F. Roeder and T. H. Baum (2001). "Liquid delivery MOCVD process for deposition of high frequency dielectric materials", U.S. Pat. No. 6,277,436.

Sugitani, S. and T. Enoki (2004). "Method and apparatus for manufacturing organic electric insulator films by plasma CVD", JP2004/079815.

Vaartstra, B. A. (2001). "Method for forming metal-containing films using metal complexes with chelating O- and/or N-donor ligands", U.S. Pat. No. 6,225,237.

Warner, G. H. (1969). "Amine ethers", U.S. Pat. No. 3,426,072.

Warner, G. H. (1969). "Preparation of Amine Ethers", GB1,154,418.

Watson, I. M., M. P. Atwood and S. Haq (1994). "Investigations of Barium Beta-Diketonate Complexes Used in Chemical-Vapor-Deposition of High-T-C Oxide-Films", Superconductor Science & Technology 7(9): pp 672-680.

Weiss, F., K. Frohlich, R. Haase, M. Labeau, D. Selbmann, J. P. Senateur and O. Thomas (1993). "Preparation of YBa2Cu3O7 Films by Low-Pressure Mocvd Using Liquid Solution Sources", Journal De Physique IV 3(C3): pp 321-328.

Williams, P. A., A. C. Jones, P. J. Wright, M. J. Crosbie, J. F. Bickley, A. Steiner, H. O. Davies and T. J. Leedham (2002). "The Unusual Thermal Stabilization of MOCVD Precursors by the Dibenzoyl Methanate Group: Liquid Injection MOCVD of Tantalum Oxide and Niobium Oxide Using M(OEt)4(dbm) Precursors", Chemical Vapor Deposition 8: 110.

Xia, C. F., T. L. Ward, C. Y. Xu, P. Atanasova and R. W. Schwartz (1998). "Fabrication of Ag/Y2O3-stabilized ZrO2 composite films by metallorganic chemical vapor deposition", Journal of the Electrochemical Society 145(1): L4-L8.

Yuan, F. C., Y. Y. Xie, J. P. Chen, G. W. Yang and B. J. Cheng (1996). "Preparation of YBCO/Ag superconducting tapes with a high current-carrying capacity by MOCVD using a single solution source from a supersonic atomizer", Superconductor Science & Technology 9(11): pp 991-993.

U.S. Pat. No. 6,399,208, U.S. Pat. No. 6,623,656, U.S. Pat. No. 7,094,284.

BRIEF SUMMARY OF THE INVENTION

The present invention relates to a liquid formulation useful for deposition of metal-containing thin films in making semiconductor devices comprising: a) at least one metal-ligand complex wherein one or more ligands are selected from the group consisting of β-diketonate, β-diketoesterate, β-ketoiminate, β-diiminate, alkyl, carbonyl, cyclopentadienyl, pyrrolyl, imidazolyl, amidinate, alkoxide, and mixtures thereof, wherein the ligand can be monodentate, bidentate and multidentate, complexing to the metal atoms, and the metal is selected from Group 2 to 16 elements of the Periodic Table of the Elements; and, b) aminoethers are selected from a formula consisting of $R^1R^2NR^3OR^4NR^5R^6$, $R^1OR^4NR^5R^6$, $O(CH_2CH_2)_2NR^1$, $R^1R^2NR^3N(CH_2CH_2)_2O$, $R^1R^2NR^3OR^4N(CH_2CH_2)_2O$, $O(CH_2CH_2)_2NR^3OR^4N(CH_2CH_2)_2O$, and mixtures thereof wherein $R^{1-2}$ and $R^{5-6}$ are independently selected from group consisting of $C_{1-10}$ linear alkyl, $C_{1-10}$ branched alkyl, $C_{1-10}$ cyclic alkyl, $C_6$-$C_{10}$ aromatic, $C_{1-10}$ alkylamine, $C_{1-10}$ alkylaminoalkyl, $C_{1-10}$ ether, $C_4$-$C_{10}$ cyclic ether, $C_4$-$C_{10}$ cyclic aminoether; and $R^{3-4}$ are independently selected from group consisting of $C_{1-10}$ linear alkylene, $C_{1-10}$ branched alkylene, $C_{1-10}$ cyclic alkylene, $C_6$-$C_{10}$ aromatic, $C_{1-10}$ alkylamine, $C_{1-10}$ alkylaminoalkyl, $C_{1-10}$ ether, $C_4$-$C_{10}$ cyclic ether, $C_4$-$C_{10}$ cyclic aminoether, and mixture thereof.

DETAILED DESCRIPTION OF THE INVENTION

Figure 1:
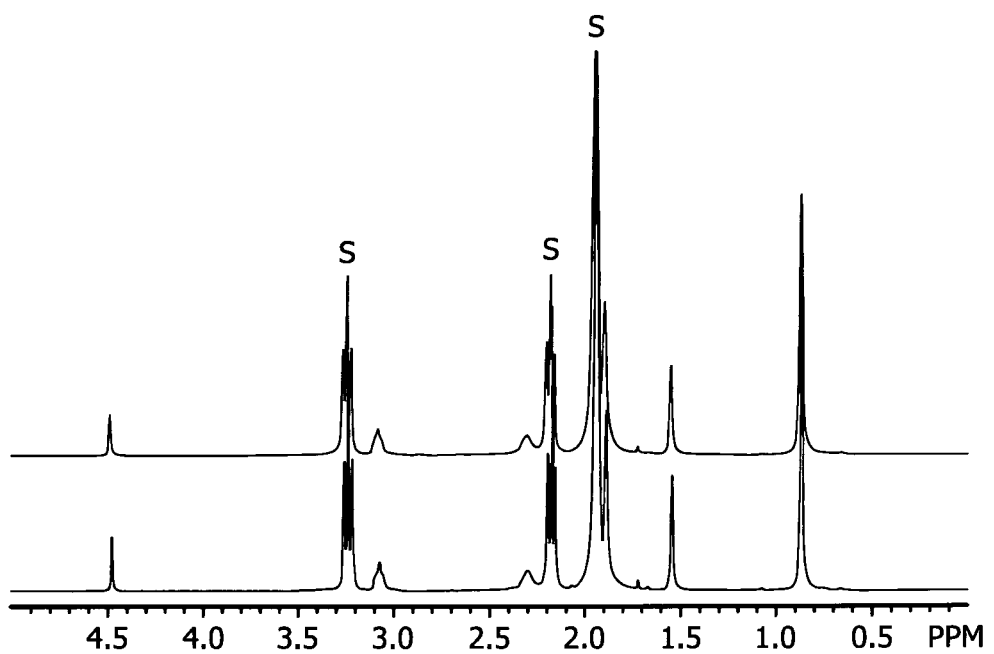
FIG. 1 is a graph of a proton nuclear magnetic resonance (NMR) spectrum of 0.75 M solution of bis(2,2-dimethyl-5-(dimethylaminoethyl-imino)-3-hexanonato-N,O,N')strontium in 2,2'-oxybis(N,N-dimethylethanamine) stored at 25° C. (top graph line) and after heating for one hour at 160° C. (bottom graph line).

The present invention is an improved novel solvent formulation for DLI of metalorganic precursors, which may allow the use of a single solvent system and may also allow to use a solvent which combines the properties of at least two different solvent molecules.

More specifically, this invention is related to a liquid formulation useful for deposition of thin films in making semiconductor devices comprising: a) at least one metal complex selected from the group consisting of metal β-diketonates, metal β-diketoesterate, metal β-ketoiminates, metal β-diiminates, metal alkyls, metal carbonyl, alkyl metal carbonyl, metal cyclopentadienyls, metal pyrrolyls, metal imidazolyls, metal amidinates, and metal alkoxides, wherein the ligand can be monodentate, bidentate and multidentate, complexing to the metal atoms, and the metal is selected from Group 2 to 15 elements of the Periodic Table of the Elements; and, b) aminoether solvents having both tertiary amino and ether groups. We have found that precursor formulations containing aminoether solvents provide improved delivery of metalorganic precursors by preferably DLI, as demonstrated in the examples, by a more stable vaporization process with a low amount of solid residue in the vaporizer device.

More specifically, DLI is a preferred delivery method for a high volume manufacturing process, whereby allowing metalorganic precursors to be used to deposit metallic films, metal oxide films, dielectric films or other films, which implement these precursors in semiconductor devices or other devices, such as: photovoltaics, MEMS and displays. Desired precursors, based on chosen deposition characteristics, may pose challenges for implementation with DLI. Many precursors are viscous liquids, that require addition of a solvent to improve the viscosity, necessary for delivery (<100 cP and more preferably <50 cP). For this reason, the addition of an aminoether solvent provides high solubility and lower viscosity, that will allow for good delivery. Other precursors may be solids at room temperature and require dissolution in a solvent to allow for compatibility with DLI.

In both cases, the solvent system performs several functions. First, the solvent system is one mechanism for heat transfer during the vaporization process. During the vaporization process, the solvent should not react with the precursor. The aminoethers, containing both tertiary amino and ether groups, do not have any chemical reactivity due to the lack of active hydrogen such as OH or NH groups, such as are present in alcohols or primary and secondary amines; but, the aminoethers do possess polar coordinating groups. The lack of reactive groups is important to minimize reactivity with the precursor during the vaporization process. Other solvents, such as alcohols, may react with the precursors or exchange ligands with the precursor, which may lead to precipitates forming in the injector system and/or downstream in the delivery lines.

The second key point is that the weak coordinating effect of the solvent with a precursor may provide an added layer of protection during the vaporization process. Although multiple commercial injection system designs exist, a primary mechanism for vaporization is heat transfer to the precursor. During the process, the heat can be transferred through hot metal surface contact in the injector with the liquid system and/or through heat transfer with a hot carrier gas. In either case, it is important that the metalorganic precursor is not subjected to significantly elevated temperatures, that may cause thermal decomposition. By having a solvent system that has some coordinating function of both oxygen and nitrogen along with high solubility, the vaporization process is thought to be more gentle to the precursor and allows for efficient vaporization into the gas phase. The coordinating effect can not be strong or essentially permanent under the existing conditions, given the downstream impact to the deposition process. Therefore, the solvation effect may provide additional stabilization in the gas phase during delivery.

Lower vapor pressure precursors require higher vaporization temperatures in order to achieve reasonable precursor flux into the deposition chamber, especially when used in combination with multi-wafer process chambers. A suitable solvent for DLI has to provide good solubility for a desired precursor in order to have a high precursor flux, while also allowing for efficient vaporization of a desired precursor with minimum residue in the vaporizer. High solubility of precursor in the solvent is desired to avoid fast precipitation of precursor during initial solvent evaporation and also to limit precursor dilution in the gas phase with solvent molecules. However, in many cases it is quite challenging to find solvents capable to dissolve >0.5 M of the metalorganic precursor. The solvent composition should also be stable at ambient conditions for extended period of time during storage and delivery. The solvent or solvent mixture should also not to decompose during vaporization of the precursor, not to adversely adsorb or react on the growing film surface, resulting in unwanted impurities in the resulting film. To deliver moisture-sensitive metalorganic precursors, the solvent also has to be moisture free. Matching the boiling point of the solvent with vaporizer operating conditions is also important to avoid fast vaporization of a solvent from the composition. Early evaporation of the solvent can lead to eventual clogging of the injector system, minimizing efficacy of the delivery process. However, it is important that the injector temperature is high enough so that higher precursor vapor pressures can be achieved; and, the solvent system is matched to the needs of the precursor and deposition system.

In order to prevent precursor precipitation into the injector prior to vaporization, the solvent needs to have several unique properties. First high solubility is critical to minimize premature fall out or precipitation of the precursor. Ideally, the solute concentration would operate below the solubility limit in the solvent, in order to prevent early injector clogging. This creates a desired solubility of >0.5M of solute in the solvent, in order to have desired operating precursor concentrations from 0.1M-0.5M. Even very low levels of precipitation can lead to unacceptable failure rates for injector systems.

In order to have high precursor concentrations, it is typically required to operate the injection systems at elevated temperatures (100° C.-250° C.). One reason for this is because the high concentrations of precursor that are vaporized into the gas phase can not exceed the precursor's vapor pressure, otherwise condensation will occur in the lines. For this reason, the injector temperature is chosen based on the precursor physical properties and the desired precursor flux into the deposition chamber. The solvent system needs to be compatible with the injector temperature, requiring the solvent boiling point to be matched with the injector.

The vaporized precursor(s) and solvent are carried downstream to the deposition chamber. At this point in the process, the solvent ideally has minimal reaction with the substrate surface and does not inhibit the precursor reaction with the surface. The aminoether solvent systems have minimal reactivity and should not inhibit the deposition process.

In some examples, the liquid formulation may be implemented for delivery to a deposition process, such as: chemical vapor deposition, cyclic chemical vapor deposition, plasma-enhanced chemical vapor deposition and atomic layer deposition. However, the liquid formulation can be more broadly applied to any deposition or gas phase process, whereby a metalorganic precursor needs to be delivered to the gas phase, while maintaining the precursor structural integrity, with minimal decomposition.

A single solvent composition is desired to reduce cost of operation and also to avoid undesired interactions between different solvents and the precursor. In reference to the requirement for solubility and boiling point matching, mixtures of solvents may address the solubility, but will provide challenges during vaporization given differences in both boiling points and heats of vaporization.

Aminoether solvents may be employed with any suitable metal precursors, which have good solubility in selected aminoether solvents, have good thermal stability in selected aminoether solvent and their solutions have desired physical properties for a selected DLI system, such as for example: viscosity, density, and boiling point.

Metal precursors described in this invention comprise metals selected from Group 2 to Group 16 of the Periodic Table of the Elements, and specific examples of metals include Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo and W to which is bound at least one ligand selected from the group consisting of β-diketonates, β-diketoesterates, β-ketoiminates, β-diiminates, alkyls, carbonyls, cyclopentadienyls, pyrrolyls, imidazolyls, amidinates, alkoxides, and mixtures thereof, wherein the ligand can be monodentate, bidentate and multidentate, complexing to the metal atoms.

Examples of the metal-ligand complexes described in this invention are illustrated as following classes:

(a) metal β-diketonates having the formula:

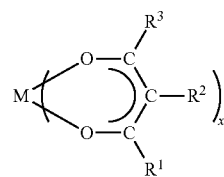

wherein M is selected from Group 2 to 16 metals, and specific examples of metals include Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te; wherein $R^{1-3}$ are independently selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; wherein x=2, 3, 4;

(b) metal β-ketoiminates having the formula:

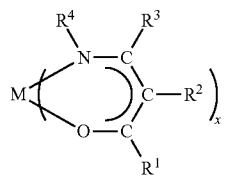

wherein M is selected from Group 2 to 16 metals, and specific examples of metals include Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te; wherein $R^{1-4}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; wherein x=2, 3, 4;

(c) metal β-diiminates having the formula:

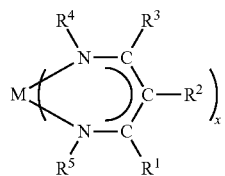

wherein M is selected from Group 2 to 16 metals, and specific examples of metals include Mg, Ca, Sr, Ba, Y, La, Ce, Sm, Tb, Er, Yb, Lu, Ti, Zr, Hf, Fe, Co, Ni, Ru, Rh, Cu, Al, Sn, Pb, Sb, Bi, Te; wherein $R^{1-5}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; wherein x=2, 3, 4;

(d) metal β-ketoiminates having the formula:

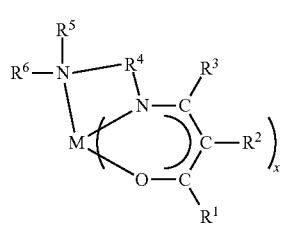

wherein M is selected from Group 2 to 16 metal; $R^{1-3}$ and $R^{5-6}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^4$ is selected from group consisting of hydrogen, $C_{1-10}$ linear or branched alkylene, $C_{1-10}$ linear or branched alkoxy, $C_{4-10}$ cycloaliphatic, $C_{6-10}$ aryl, and $C_{1-10}$ linear or branched fluorinated alkylene; and x=2,3;

(e) metal β-ketoiminates having the formula:

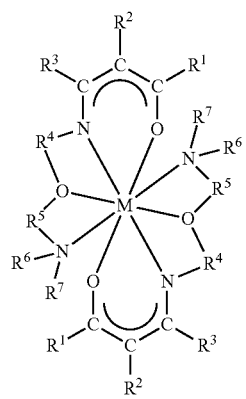

wherein M is an alkaline earth metal selected from Group 2, and specific examples of metals include Ca, Sr and Ba; wherein $R^1$ is a branched bulky alkyl group containing 4 to 10 carbon atoms; $R^2$ is selected from the group consisting of hydrogen, $C_{1-10}$ linear or branched alkyl, $C_{1-10}$ linear or branched alkoxy, $C_{4-10}$ cycloaliphatic, and $C_{6-10}$ aryl; $R^3$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^{4-5}$ are individually selected from the group consisting of $C_{1-10}$ linear or branched alkylene, $C_{1-10}$ linear or branched alkoxy, $C_{4-10}$ cycloaliphatic, $C_{6-10}$ aryl, and $C_{1-10}$ linear or branched fluorinated alkylene; preferably $R^{4,5}$ contain 2 carbon atoms, thus making a five-member coordinating ring to the metal center; $R^{6-7}$ are individually selected from the group consisting of $C_{1-10}$ linear or branched alkyl, $C_{1-10}$ linear or branched fluoroalkyl, $C_{4-10}$ cycloaliphatic, $C_{6-10}$ aryl, and they can be connected to form a ring containing carbon, oxygen, or nitrogen atoms;

(f) metal β-ketoiminates having the formula:

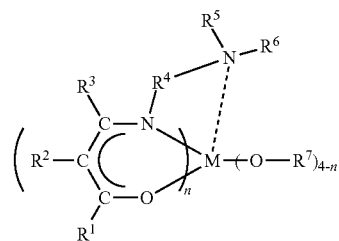

wherein M is a metal selected from Group 4 metals, including titanium, zirconium, and hafnium; wherein $R^1$ is a branched bulky alkyl group containing 4 to 10 carbon atoms; $R^2$ is selected from the group consisting of hydrogen, $C_{1-10}$ linear or branched alkyl, $C_{1-10}$ linear or branched alkoxy, $C_{4-10}$ cycloaliphatic, and $C_{6-10}$ aryl; $R^3$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^4$ is selected from group consisting of $C_{1-10}$ linear or branched alkylene $C_{1-10}$ linear or branched alkoxy, $C_{4-10}$ cycloaliphatic, $C_{6-10}$ aryl, and $C_{1-10}$ linear or branched fluorinated alkylene; preferably $R^4$ contains 2 to 3 carbon atoms, thus making a five- or six-member coordinating ring to the metal center; $R^{5-6}$ are linear or branched, individually selected from the group consisting of $C_{1-10}$ linear or branched alkyl, $C_{1-10}$ linear or branched fluoroalkyl, $C_{4-10}$ cycloaliphatic, and $C_{6-10}$ aryl, and they can be connected to form a ring containing carbon, oxygen, or nitrogen atoms; $R^7$ is selected from the group consisting of $C_{1-10}$ linear or branched alkyl, $C_{1-10}$ linear or branched fluoroalkyl, $C_{4-10}$ cycloaliphatic, and $C_{6-10}$ aryl; n=1,2,3;

(g) metal β-ketoiminates having the formula:

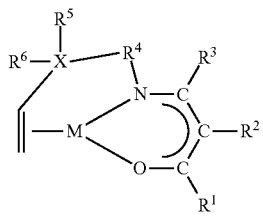

wherein M is a metal selected from Group 11 metals, including copper, silver, and gold; wherein $R^1$ is a branched bulky alkyl group containing 1 to 10 carbon atoms; $R^2$ is selected from the group consisting of hydrogen, $C_{1-10}$ linear or branched alkyl, $C_{1-10}$ linear or branched alkoxy, $C_{4-10}$ cycloaliphatic, and $C_{6-10}$ aryl; $R^3$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^4$ is selected from group consisting of $C_{1-10}$ linear or branched alkylene $C_{1-10}$ linear or branched alkoxy $C_{4-10}$ cycloaliphatic, $C_{6-10}$ aryl, and $C_{1-10}$ linear or branched fluorinated alkylene; $R^{3-4}$ are individually selected from the group consisting of $C_{1-10}$ linear or branched alkyl, $C_{1-10}$ linear or branched fluoroalkyl, $C_{4-10}$ cycloaliphatic, and $C_{6-10}$ aryl, preferably $R^4$ contains 2 to 3 carbon atoms, thus making a five- or six-member coordinating ring to the metal center; $R^{5-6}$ are individually selected from the group consisting of $C_{1-10}$ linear or branched alkyl, $C_{1-10}$ linear or branched fluoroalkyl, $C_{4-10}$ cycloaliphatic, and $C_{6-10}$ aryl, and they can be connected to form a ring containing carbon, oxygen, or nitrogen atoms; X is carbon or silicon;

(h) metal complexes having the formula:

wherein M is selected from Group 2 to 16 metals, and specific examples of metals include Mg, Ca, Sr, Ba, Y, La, Ce, Sm, Tb, Er, Yb, Lu, Ti, Zr, Hf, Fe, Co, Ni, Ru, Ir, Rh, Cu, Al, Pb, Sb, Bi, Te; wherein each R is individually selected from the group consisting of hydrogen, $C_{1-10}$ linear, branched, saturated or unsaturated alkyl, $C_{1-10}$ linear or branched alkoxy, $C_{4-10}$ cycloaliphatic, $C_{6-10}$ aryl, $C_{1-10}$ linear or branched fluorinated alkyl, cyclopentadienyl ("Cp"), alkyl substituted cyclopentadienyl, pyrollyl, alkyl substituted pyrollyl, imidazolyl, alkyl substituted imidazolyl, and their derivatives; wherein x=2, 3, 4; L is a neutral or mono anion donor ligand containing oxygen or nitrogen atoms, such as: $NMe_2$ or OMe; and n=0, 1, 2, 3, 4; Exemplary metal complexes include, but not limited to: Ru(EtCp), Ru(DMPD)(EtCp) (DMPD=2,4-dimethyl-pentadienyl), EtCpTi(NMe_2)_3, Cp*Ti(OMe)3, EtCpHf(NMe_2)_3, and EtCpZr(NMe_2)_3, Sr($^tBu_3Cp)_2$, Ba($^tBu_3Cp)_2$, Sr(iPr)$_3$Cp)_2, Ba(($^iPr_3Cp)_2$ where "Et" is ethyl, "Me" is methyl, "$^iPr$" is iso-propyl, "$^tBu$" is tert-butyl.

(i) Alkyl metal carbonyl having the formula:

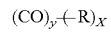

wherein M is selected from Group 2 to 16 metals, and specific examples of metals include Mg, Ca, Sr, Ba, Y, La, Ce, Sm, Tb, Er, Yb, Lu, Fe, Co, Ni, Ru, Ir, Rh, Cu, Al, Pb, Sb, Bi, Te; wherein each R is individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, $C_{1-10}$ linear or branched fluorinated alkyl, cyclopendienyl and their derivatives; wherein x=2, 3, 4 and y=1, 2, 3, or 4;

(j) metal carbonyls having the formula:

wherein M is selected from Group 8 to 10 metals and specific examples of metals include Fe, Co, Ni, Ru, Ir, Rh; wherein x=1, 2, 3 and y=4 to 12;

(k) metal alkoxides having the formula:

wherein M is selected from Group 2 to 16 metal, where specific examples of metals include Mg, Ca, Sr, Ba, Y, La, Ce, Sm, Tb, Er, Yb, Lu, Fe, Co, Ni, Ru, Ir, Rh, Cu, Al, Pb, Sb, Bi, Te; wherein each R is individually selected from the group consisting of $C_{1-10}$ linear or branched alkyl, $C_{1-10}$ linear or branched alkenyl, $C_{1-10}$ linear or branched alkynyl, cycloaliphatic, $C_{6-10}$ aryl, and $C_{1-10}$ linear or branched fluorinated alkyl; wherein n is 2, 3, 4 or 5, comprising the valence of M. Exemplary metal complexes include Ti($^iPrO)_4$, Hf(OBu$^t$)_4, Zr(OBu$^t$)_4, and Ta_2(OEt)_{10}$;

(l) metal amides having the formula:

wherein M is selected from Group 2 to 16 metal, where specific examples of metals include Mg, Ca, Sr, Ba, Y, La, Ce, Sm, Tb, Er, Yb, Lu, Fe, Co, Ni, Ru, Ir, Rh, Cu, Al, Pb, Sb, Bi, Te; wherein $R^{1-2}$ are independently selected from the group consisting of $C_{1-10}$ linear or branched alkyl, $C_{1-10}$ linear or branched alkenyl, $C_{1-10}$ linear or branched alkynyl, $C_{3-10}$ linear or branched alkylsilyl, $C_4$-$C_{10}$ cycloaliphatic, $C_{6-10}$ aryl, and $C_{1-10}$ linear or branched fluorinated alkyl; wherein n is the integer 2, 3, 4, or 5, comprising the valence of M;

(m) metal alkoxy β-diketonates having the formula:

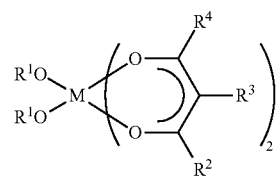

wherein M comprises a metal selected from the group consisting of Ti, Zr, and Hf; $R^1$ is an alkyl group comprising from 1 to 10 carbon atoms; $R^2$ is an alkyl group comprising from 1 to 10 carbon atoms; $R^3$ is selected from the group consisting of hydrogen or an alkyl group comprising from 1 to 3 carbon atoms; $R^4$ is an alkyl group comprising from 1 to 6 carbon atoms.

(n) metal amidinates having the formula:

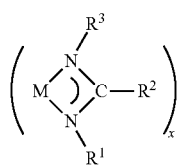

wherein M is selected from Group 2 to 16 metals, and specific examples of metals include Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te; wherein $R^{1-3}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; wherein x=2, 3, 4;

The solvents utilized in this invention should be chemically compatible with metalorganic precursors. The solvent concentration can vary in the range of 1 to 99% by weight, depending on the complexes and the aminoethers employed. Preferably, the boiling point of the aminoether is greater than 120° C., and more preferably the boiling point of the aminoether is greater than 150° C. but less than 250° C., and the viscosity of the resulting solution is in the range of 1 to 50 cP, which can be delivered by direct liquid injection via a commercial vaporizer.

Examples of aminoethers containing both tertiary amino and ether groups described in this invention are illustrated in the following classes:

(a) linear aminoethers with a general formula of: $R^1R^2NR^3OR^4NR^5R^6$, wherein $R^1$-$R^6$ are independently selected from group consisting of $C_{1-10}$ linear alkyl, $C_{1-10}$ branched alkyl, $C_{1-10}$ cyclic alkyl, $C_6$-$C_{10}$ aromatic. Examplary structures are shown below:

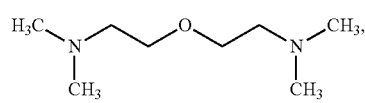

2,2'-oxybis(N,N-dimethylethanamine)

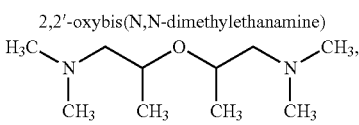

2,2'-oxybis(N,N-dimethylpropan-1-amine)

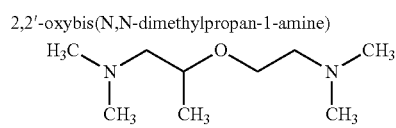

2-[2-(dimethylamino)ethoxy]-(N,N-dimethylpropan-1-amine)

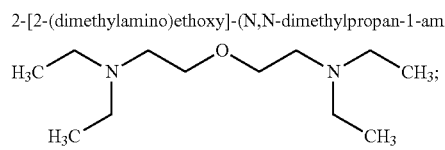

2,2'-oxybis(N,N-diethylethanamine)

(b) linear aminoethers with a general formula of: $R^1OR^4NR^5R^6$, wherein $R^{1-6}$ are selected independently from the group consisting of $C_{1-10}$ linear alkyl, $C_{1-10}$ branched alkyl, $C_{1-10}$ cyclic alkyl, $C_6$-$C_{10}$ aromatic. An examplary structure is shown below:

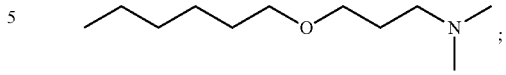

N,N-dimethyl hexyloxypropylamine (c) cyclic aminoethers with a general formula: $O(CH_2CH_2)_2NR^1$, wherein $R^1$ is $C_{1-10}$ linear alkyl, $C_{1-10}$ branched alkyl, $C_{1-10}$ cyclic alkyl, $C_6$-$C_{10}$ aromatic. Exemplary structures are shown below:

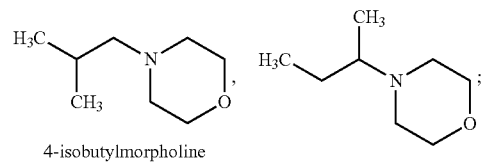

4-isobutylmorpholine        4-sec-butylmorpholine (d) cyclic aminoethers with a general formula: $R^1R^2NR^3N(CH_2CH_2)_2O$, wherein $R^{1-4}$ are individually: $C_{1-10}$ linear alkyl, $C_{1-10}$ branched alkyl, $C_{1-10}$ cyclic alkyl, $C_6$-$C_{10}$ aromatic. An examplary structure is shown below:

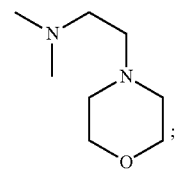

4-[2-(dimethylamino)ethyl]morpholine (e) cyclic aminoethers with a general formula: $R^1R^2NR^3OR^4N(CH_2CH_2)_2O$, wherein $R^{1-4}$ are individually: $C_{1-10}$ linear alkyl, $C_{1-10}$ branched alkyl, $C_{1-10}$ cyclic alkyl, $C_6$-$C_{10}$ aromatic. An examplary structure is shown below:

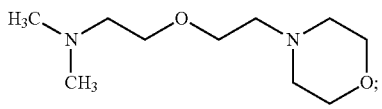

N,N-dimethyl-2-(2-morpholin-4-ylethoxy)ethanamine (f) cyclic aminoethers with a general formula: $O(CH_2CH_2)_2NR^1OR^2N(CH_2CH_2)_2O$, wherein $R^{1-2}$ are individually: branched alkyl, $C_{1-10}$ cyclic alkyl. An examplary structure is shown below:

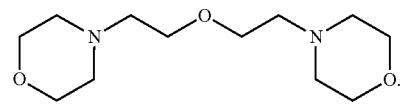

4,4'-(oxydiethane-2,1-diyl)dimorpholine

Without being bound by any theory, it is believed that aminoether solvents containing both amino group and ether group can provide an advantage, compared to solvents and physical mixtures of solvents having either only ether or amine functionality or other traditional solvent functionality. Without imposing any limitations, these advantages include: better solubility, better solution stability over long term storage, cleaner evaporation by flash vaporization and overall more stable DLI chemical vapor deposition process.

In one embodiment the present inventions is a formulation, comprising: a) at least one metal-ligand complex, wherein one or more ligands are selected from the group consisting of β-diketonate, β-ketoiminate, β-ketoesterate, β-diiminate, alkyl, carbonyl, alkyl carbonyl, cyclopentadienyl, pyrrolyl, alkoxide, amidinate, imidazolyl, and mixtures thereof; wherein the ligand can be monodentate, bidentate and multidentate, complexing to the metal atoms, and the metal is selected from Group 2 to 16 elements of the Periodic Table of the Elements; and, b) aminoethers are selected from a formula consisting of $R^1R^2NR^3OR^4NR^5R^6$, $R^1OR^4NR^5R^6$, $O(CH_2CH_2)_2NR^1$, $R^1R^2NR^3N(CH_2CH_2)_2O$, $R^1R^2NR^3OR^4N(CH_2CH_2)_2O$, $O(CH_2CH_2)_2NR^3OR^4N(CH_2CH_2)_2O$, and mixtures thereof wherein $R^{1-2}$ and $R^{5-6}$ are independently selected from group consisting of $C_{1-10}$ linear alkyl, $C_{1-10}$ branched alkyl, $C_{1-10}$ cyclic alkyl, $C_6$-$C_{10}$ aromatic, $C_{1-10}$ alkylamine, $C_{1-10}$ alkylaminoalkyl, $C_{1-10}$ ether, $C_4$-$C_{10}$ cyclic ether, $C_4$-$C_{10}$ cyclic aminoether; and $R^{3-4}$ are independently selected from group consisting of $C_{1-10}$ linear alkylene, $C_{1-10}$ branched alkylene, $C_{1-10}$ cyclic alkylene, $C_6$-$C_{10}$ aromatic, $C_{1-10}$ alkylamine, $C_{1-10}$ alkylaminoalkyl, $C_{1-10}$ ether, $C_4$-$C_{10}$ cyclic ether, $C_4$-$C_{10}$ cyclic aminoether, and mixture thereof.

Preferably, the formulation has a ligand of the metal-ligand complex is selected from the group consisting of monodentate, bidentate, multidentate and mixtures thereof.

In one embodiment, the formulation is in the liquid phase.

In another embodiment, the formulation comprises aminoethers with a general formula of: $R^1R^2NR^3OR^4NR^5R^6$, wherein $R^{1-2}$ and $R^{5-6}$ are independently selected from group consisting of $C_{1-10}$ linear alkyl, $C_{1-10}$ branched alkyl, $C_{1-10}$ cyclic alkyl, $C_6$-$C_{10}$ aromatic; and $R^{3-4}$ are independently selected from group consisting of $C_{1-10}$ linear alkylene, $C_{1-10}$ branched alkylene, $C_{1-10}$ cyclic alkylene, $C_6$-$C_{10}$ aromatic.

In an alternate embodiment, the formulation comprises aminoethers with a general formula of: $R^1OR^4NR^5R^6$, wherein $R^1$ and $R^{5-6}$ are selected independently from the group consisting of $C_{1-10}$ linear alkyl, $C_{1-10}$ branched alkyl, $C_{1-10}$ cyclic alkyl, $C_6$-$C_{10}$ aromatic; and $R^4$ is selected from group consisting of $C_{1-10}$ linear alkylene, $C_{1-10}$ branched alkylene, $C_{1-10}$ cyclic alkylene, $C_6$-$C_{10}$ aromatic.

A further embodiment is a formulation comprising cyclic aminoethers with a general formula: $O(CH_2CH_2)_2NR^1$, wherein $R^1$ is $C_{1-10}$ linear alkyl, $C_{1-10}$ branched alkyl, $C_{1-10}$ cyclic alkyl, $C_6$-$C_{10}$ aromatic.

Yet an additional embodiment is a formulation comprising cyclic aminoethers with a general formula: $R^1R^2NR^3N(CH_2CH_2)_2O$, wherein $R^{1-2}$ are individually: $C_{1-10}$ linear alkyl, $C_{1-10}$ branched alkyl, $C_{1-10}$ cyclic alkyl, $C_6$-$C_{10}$ aromatic; and $R^3$ is selected from group consisting of $C_{1-10}$ linear alkylene, $C_{1-10}$ branched alkylene, $C_{1-10}$ cyclic alkylene, $C_6$-$C_{10}$ aromatic.

A further additional embodiment is a formulation comprising cyclic aminoethers with a general formula: $R^1R^2NR^3OR^4N(CH_2CH_2)_2O$, wherein $R^{1-2}$ are individually: $C_{1-10}$ linear alkyl, $C_{1-10}$ branched alkyl, $C_{1-10}$ cyclic alkyl, $C_6$-$C_{10}$ aromatic; and $R^{3-4}$ are individually selected from group consisting of $C_{1-10}$ linear alkylene, $C_{1-10}$ branched alkylene, $C_{1-10}$ cyclic alkylene, $C_6$-$C_{10}$ aromatic.

Alternatively, the formulation comprises cyclic aminoethers with a general formula: $O(CH_2CH_2)_2NR^3OR^4N(CH_2CH_2)_2O$, wherein $R^{3-4}$ are individually: $C_{1-10}$ linear alkylene, $C_{1-10}$ branched alkylene, $C_{1-10}$ cyclic alkylene.

Preferably, the formulation contains an aminoether selected from the group consisting of 2,2'-oxybis(N,N-dimethylethanamine), 4-[2-(dimethylamino)ethyl]morpholine, and mixtures thereof.

Preferably, the formulation contains the aminoether 2,2'-oxybis(N,N-dimethylethanamine) having less than 20 ppm of water.

Preferably, the formulation contains the aminoether 2,2'-oxybis(N,N-dimethylethanamine) having less than 100 ppm of additional compounds containing hydroxyl or amine functionality.

In one embodiment the present invention is a liquid formulation useful for deposition of metal-containing thin films in making semiconductor devices, comprising; a) at least one metal-ligand complex selected from the group consisting of bis(2,2-dimethyl-5-(dimethylaminoethyl-imino)-3-hexanonato-N,O,N')strontium, bis(2,2-dimethyl-5-(1-dimethylamino-2-propylimino)-3-hexanonato-N,O,N')strontium, bis(2,2-dimethyl-5-(dimethylaminoethyl-imino)-3-hexanonato-N,O,N')bis(tert-butoxy)titanium, tetrakis(2,2,6,6-tetramethyl-3,5-heptanedionato)cerium (IV), tris(2,2,6,6-tetramethyl-3,5-heptanedionato)lanthanum, $Sr[(tBu)_3Cp]_2$, $Ba[(tBu)_3Cp]_2$, $LaCp_3$, $La(MeCp)_3$, $La(EtCp)_3$, $La(^iPrCp)_3$, zirconium tert-butoxide, bis(2-tert-butyl-4,5-di-tert-amylimidazolyl)strontium, bis(2-tert-butyl-4,5-di-tert-amylimidazolyl)barium, bis(2,5-di-tert-butyl-pyrrolyl)strontium, bis(2,5-di-tert-butyl-pyrrolyl)barium, $Ru(EtCp)_2$, Ru(EtCp)DMPD) and mixtures thereof; and b) at least one aminoether selected from the group consisting of 2,2'-oxybis(N,N-dimethylethanamine), 4-[2-(dimethylamino)ethyl]morpholine, and mixtures thereof; wherein "Me" is methyl, "'Bu" is tert-butyl, "'Pr" is isopropyl, "Et" is ethyl, "Cp" is cyclopentadienyl, and "DMPD" is 2,4-dimethyl-pentadienyl.

Preferably, the formulation is packaged in a stainless steel vessel. More preferably, the vessel's interior is electropolished. Still more preferably, the vessel has an inlet valve and an outlet valve. More preferably, the valves are automatic actuated valves. In one embodiment, the valves are pneumatic actuated valves. In an alternate embodiment, the valves are electric solenoid actuated valves. Preferably, the vessel has a diptube. In one embodiment, the diptube is the outlet. In an alternate embodiment, the diptube is the inlet.

Preferably, the formulation includes a chemical stabilizer. In one embodiment, the stabilizer is a free radical scavenger. In another embodiment, the stabilizer is a polymerization inhibitor. In yet another embodiment, the stabilizer is an antioxidant.

Preferably, the formulation hays a viscosity less than 50 cP.

In one embodiment, the formulation comprises 2,2'-oxybis(N,N-dimethylethanamine) and lanthanum complex selected from a group consisting of $LaCp_3$, $La(MeCp)_3$, $La(EtCp)_3$, or $La(^iPrCp)_3$. In another embodiment, the formulation comprises bis(2,2-dimethyl-5-(dimethylaminoethyl-imino)-3-hexanonato-N,O,N')strontium and 2,2'-oxybis(N,N-dimethylethanamine). In yet another embodiment, the formulation comprises bis(2,2-dimethyl-5-(1-dimethylamino-2-propylimino)-3-hexanonato-N,O,N')strontium and 2,2'-oxybis(N,N-dimethylethanamine). A further embodiment comprises $Sr(^tBu_3Cp)_2$ and 2,2'-oxybis(N,N-dimethylethanamine). A yet further embodiment comprises $Ba(^tBu_3Cp)_2$ and 2,2'-oxybis(N,N-dimethylethanamine).

The present invention is also a process for depositing a metal-containing film by chemical vapor deposition or atomic layer deposition comprising contacting a substrate under conditions to deposit a metal-containing film from a formulation of any of the above identified metal-ligand complexes and an amino ether and depositing such metal-containing film.

In one embodiment the present invention is a process for depositing a metal-containing film by chemical vapordeposition or atomic layer deposition comprising contacting a substrate under conditions to deposit a metal-containing film from a formulation containing an aminoether of the classes described above and illustrated in (a) through (t) and containing a metal-ligand complex and depositing such metal-containing film.

In another embodiment, the present invention is a process for depositing a metal-containing film by chemical vapor deposition or atomic layer deposition comprising contacting a substrate under conditions to deposit a metal-containing film from a formulation of containing an aminoether of the classes described above and illustrated in (a) through (t) and containing a metal-ligand complexes of the classes described above and illustrated in (a) through (n) and depositing such metal-containing film.

Preferably, the process includes wherein the formulation is delivered by direct liquid injection through a vaporizer.

In one aspect of this invention, the metal complex comprises metal β-ketoiminates having the formula:

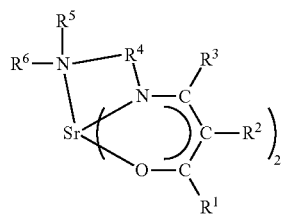

wherein $R^1$ and $R^{5-6}$ can be from the group consisting of hydrogen, $C_{1-10}$ linear or branched alkyl, $C_{1-10}$ alkoxy, $C_4$-$C_{10}$ cycloaliphatic, $C_6$-$C_{10}$ aryl, and $C_{1-10}$ fluorinated alkyl; $R^4$ is selected from group consisting of hydrogen, $C_{1-10}$ linear or branched alkylene, $C_{1-10}$ alkoxy, $C_4$-$C_{10}$ cycloaliphatic, $C_6$-$C_{10}$ aryl, and $C_{1-10}$ fluorinated alkylene.

In general, these metal precursors are solids, with mp>120° C. and low solubility in non-polar solvents. Due to very low vapor pressure, these precursors have to be delivered by a bubbling method or by DLI at 180-200° C.

The DLI method is preferred, to allow more controlled delivery rate of these precursors. We have found that aminoether solvents have good combination of physical properties for improved delivery of these precursors by DLI.

Solubility and thermal stability of 2,2-dimethyl-5-(dimethylaminoethyl-imino)-3-hexanonato-N,O,N')strontium was compared in various solvent formulations, that are shown in the Table 1. All solvents were dried over activated 3 A molecular sieves to less than 20 ppm of moisture. Solvent formulations with solubility above 0.5 M were evaluated further by $^1$H NMR at room temperature ("RT") and by $^1$H NMR of the sample heated at 150-200° C. The screening list of solvents in Table 1 represents the comparison of standard solvent systems, with an example of aminoether solvent of this invention, (2,2'-oxybis(N,N-dimethylethanamine).

TABLE I

Solvents screened by solubility and thermal stability with bis(2,2-dimethyl-5-(dimethylaminoethyl-imino)-3-hexanonato-N,O,N')strontium

| Solvent | Solvent Class | Structure | Bp, ° C. | Solubility of Sr—C | Stability |
|---|---|---|---|---|---|
| Diglyme | Polyether (glyme) | | 162 | ~0.65 M | Stable up to ~220° C. |
| Propylene Carbonate | Cyclic carbonate | | 240 | NA (reacts) | Reacts at RT |
| G-Butyrolactone | Cyclic ester | | 204 | >0.25 M | Reacts at RT |
| Isoamyl acetate | Linear ester | | 142 | >0.75 M | Reacts at 150° C. |

TABLE I-continued

Solvents screened by solubility and thermal stability with bis(2,2-dimethyl-5-(dimethylaminoethyl-imino)-3-hexanonato-N,O,N')strontium

| Solvent | Solvent Class | Structure | Bp, ° C. | Solubility of Sr—C | Stability |
|---|---|---|---|---|---|
| 1-Octanol | Primary Alcohol | | 196 | >0.5 M | Reacts by ligand exchange |
| Dibutyl Ether | Ether | | 142 | <0.25 M | Likely stable |
| 2-Nonanone | Ketone | | 193 | >0.75 M | Reacts >80° C. |
| Pentamethyl-diethylene triamine | Polyamine | | 198 | ~0.5 M | Likely stable |
| 2,2'-oxybis(N,N-dimethylethanamine) | Amino ether | | 189 | >0.75 M | Stable up to ~220° C. |

The reactivity of the solvent with the precursor will lead to manufacturing issues, shelf life stability issues, and also, unacceptable performance via clogging of the injector. Alcohol solvents, such as 1-octanol, were observed to undergo ligand exchange with the precursors. In some of the solvent testing, such as 2-nonanone and isoamyl acetate, the reaction with the precursor was only observed when the solution was heated to higher temperatures. The reactivity at elevated temperatures was found to be very important for stability during the DLI process, where the injector temperature is typically 100-300° C.

Dibutyl ether appeared to be stable, but had very low solubilities, similar to hydrocarbon solvents that we had tested. Out of the solvent screening tests, glyme type solvents and aminoether solvents both had good solubility and no observable reactivity with the solvent. Aminoether solvents of the current invention demonstrated the best combination of by (180-200° C.), high solubility (>0.75 M) and good thermal stability.

Specifically, direct liquid injection testing was performed with 2 solvents, representing these solvent classes: bis(dimethylamino)ethylether, also known as 2,2'-oxybis(N,N-dimethylethanamine), and di(propylene glycol) dimethylether (DPGDME).

In Table 2, the main factors for DLI performance are compared between tests performed with 0.3M solutions of the Sr ketoiminate complex: bis(2,2-dimethyl-5-(1-dimethylamino-2-propyl-imino)-3-hexanonato-N,O,N')strontium, in these solvents. As is quickly observed from Table 2, 2,2'-oxybis(N,N-dimethylethanamine), performed better in all cases. Continuous liquid pulsing of the precursor was performed during testing of both solvent systems, using an offline commercial vaporization system. Downstream pressure stability is employed as an early indication of vaporization issues and has been found in our lab to correlate with the level of residues that are formed. During the continuous operation of the DLI system, it was found that the experiments with DPGDME had intermittent pressure spikes during the run. In addition, it was noted that the DPGDME tests generate 1 mg/hour of residue in the injector. Given the required delivery system uptime of greater than 1 month of continuous operation, the DPGDME solution did not provide acceptable residue levels for testing, and the estimate based on a commercial vaporizer is that the injector would clog within 8 days of continuous operation.

In comparison, testing with 0.3 M solution of bis(2,2-dimethyl-5-(1-dimethylamino-2-propyl-imino)-3-hexanonato-N,O,N')strontium in 2,2'-oxybis(N,N-dimethylethanamine) demonstrated good pressure stability, at least 5 times less residue levels and greater than 1 month of run time, based on continuous liquid operation.

TABLE 2

Comparison of DLI performance of 0.3M bis(2,2-dimethyl-5-(1-dimethylamino-2-propyl-imino)-3-hexanonato-N,O,N')strontium in two different solvent systems

| Solvent System | Level of residue generated | Solubility limit of Sr-cmpd in solvent system | Pressure Stability | Estimated Run Time before clogging |
|---|---|---|---|---|
| DPGDME | 1 mg/hour | 0.6M | Low | 8 days |
| 2,2'-oxybis(N,N-dimethylethanamine) | <0.2 mg/hour | 1.0M | Good | 42 days |

Solutions of bis(2,2-dimethyl-5-(dimethylaminoethyl-imino)-3-hexanonato-N,O,N')strontium in 2,2'-oxybis(N,N-dimethylethanamine) were stable up to at least one hour at 160° C., as shown in FIG. 1. Also, no thermal effects were observed, when the solutions were tested by differential scanning calorimetry ("DSC") up to 220° C.

Figure 2:
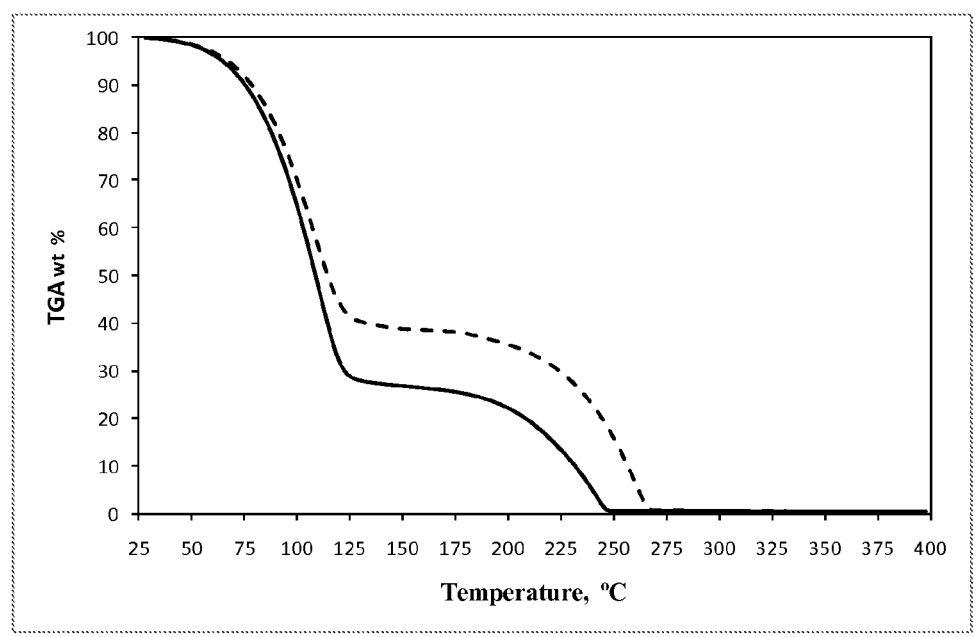
FIG. 2 is a graph of a thermogravimetric analysis (TGA) of 0.7 M solution of bis(2,2-dimethyl-5-(dimethylaminoethylimino)-3-hexanonato-N,O,N')strontium in 2,2'-oxybis(N,N-dimethylethanamine) (dashed line, 0.42 wt % residue at 400° C.) and 0.5 M of bis(2,2-dimethyl-5'(methylaminopropyl-imino)-3-hexanonato-N,O,N')strontium in 2,2'-oxybis(N,N-dimethylethanamine) (solid line, 0.34 wt % residue at 400° C.).

It was also discovered that solutions of strontium precursors in 2,2'-oxybis(N,N-dimethylethanamine) evaporate below 300° C., with very low solid residue (<1%), when heated under nitrogen flow in a TGA instrument, FIG. 2.

Figure 3:
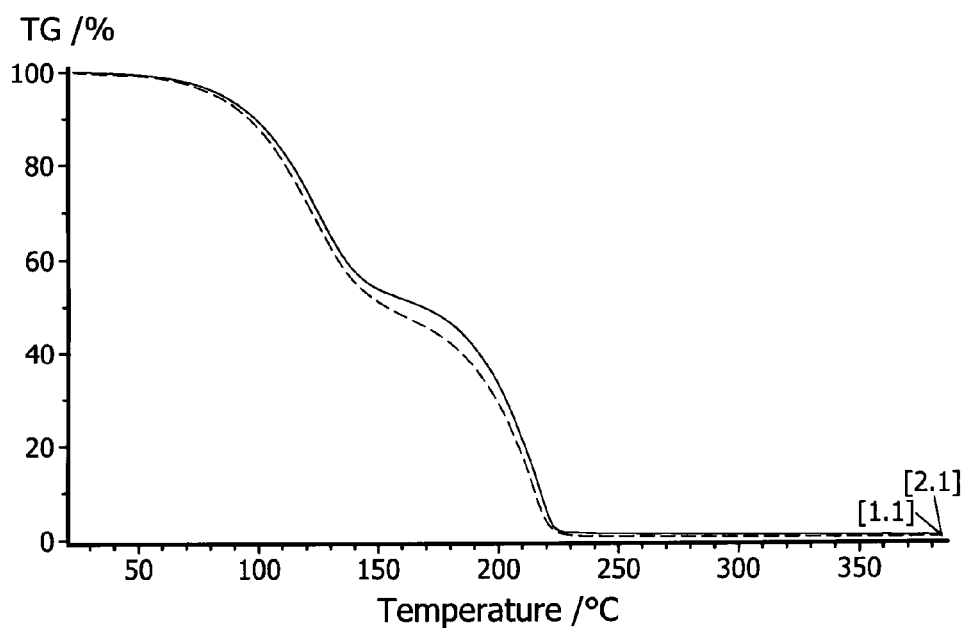
FIG. 3 is a graph of a thermogravimetric analysis (TGA) of 1.1 M bis(2,2-dimethyl-5-(dimethylaminoethyl-imino)-3-hexanonato-N,O,N')bis(tert-butoxy)titanium (dashed line) and 1M bis(2,2-dimethyl-5-(dimethylaminoethyl-imino)-3-hexanonato-N,O,N') bis(iso-propoxy)titanium in 2,2'-oxybis(N,N-dimethylethanamine) (solid line), respectively.

This is also true for titanium precursors in FIG. 3.

In one embodiment of this invention, aminoether solvents contain less than 100 ppm of moisture, preferably less than 20 ppm of moisture, and more preferably less than 5 ppm of moisture. Water can be removed from aminoether solvents by any suitable means, such as for example: fractional distillation, adsorption, chemical reaction. In one embodiment, water is removed by contacting aminoether solvents with molecular sieves in dynamic or static mode.

Without being bound by any theory, it is believed that aminoethers may stabilize metal complexes in both liquid and vapor phases and improve delivery of precursors to the deposition reactor by the formation of relatively weakly stable adducts with metal complexes.

Figure 4:
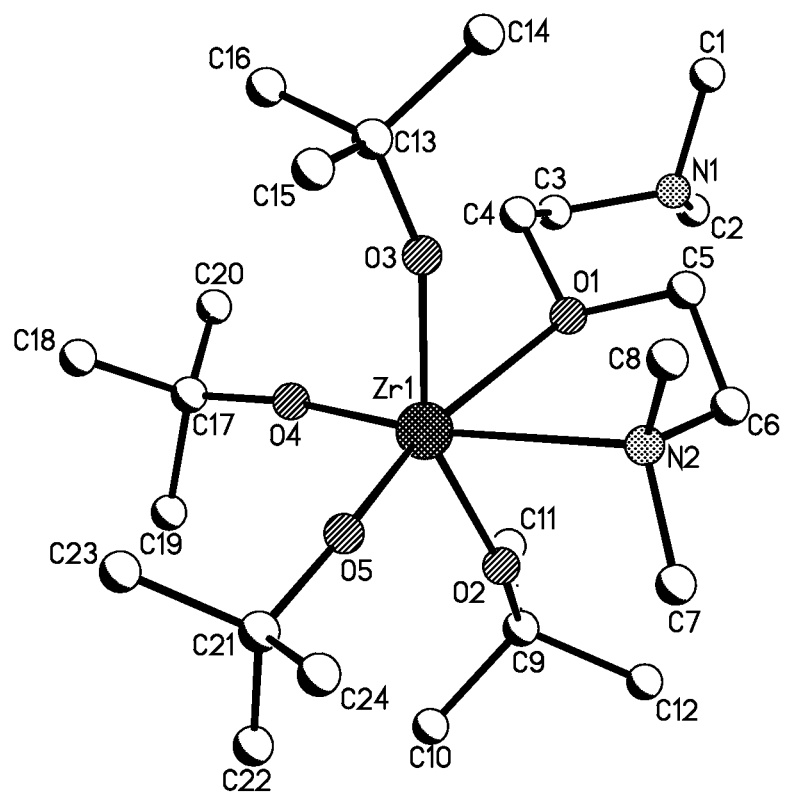
FIG. 4 is the crystal structure of the 1/1 adduct complex between zirconium tert-butoxide and 2,2'-oxybis(N,N-dimethylethanamine), demonstrating that 2,2'-oxybis(N,N-dimethylethanamine) can coordinate to the metal, and thus, stabilize the metal complex.

FIG. 4 shows the crystal structure of the 1/1 adduct complex between zirconium tert-butoxide and 2,2'-oxybis(N,N-dimethylethanamine), where aminoether is bound to the metal via both oxygen and nitrogen atoms from 2,2'-oxybis(N,N-dimethylethanamine) and thus potentially stabilizing the zirconium complex by saturating the coordination environment, i.e. increasing the coordination number from four to six.

Figure 5:
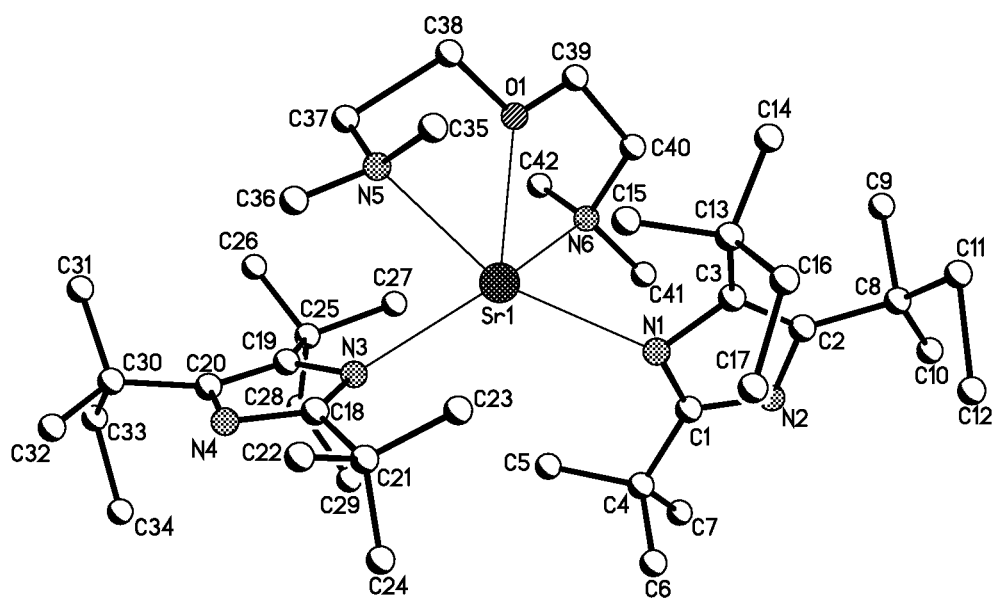
FIG. 5 is the crystal structure of the 1/1 adduct complex between bis(2-tert-butyl-4,5-di-tert-amylimidazolyl)strontium and 2,2'-oxybis(N,N-dimethylethanamine).

FIG. 5 shows the crystal structure of the 1/1 adduct complex between bis(2-tert-butyl-4,5-di-tert-amylimidazolyl) strontium and 2,2'-oxybis(N,N-dimethylethanamine), where aminoether is bound to the metal center in a chelating fashion using an ether oxygen atom and both of the tertiary amino groups.

Without being bound by any theory it is also believed that aminoether solvents may improve delivery of metalorganic precursors by providing low viscosity formulations with shear thinning effect. Viscosity of these formulations is reduced with high shear rates, which may be important for delivery via narrow lines.

Figure 6:
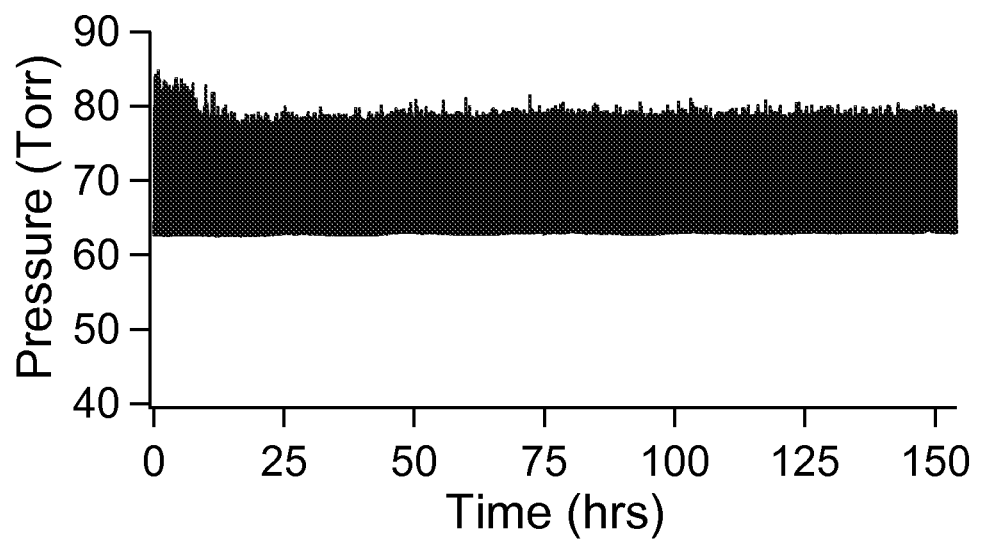
FIG. 6 shows pressure responses during pulsed vaporization of 0.3 M solution bis(2,2-dimethyl-5-(dimethylaminoethyl-imino)-3-hexanonato-N,O,N')strontium in 2,2'-oxybis(N,N-dimethylethanamine) in a DLI system, demonstrating the stability of the vaporization process, after at least 54 hours of operation.

The liquid formulation of this invention can be used in any liquid injection CVD or ALD process with any delivery means currently employed. In one aspect of this invention, the liquid formulation, comprising aminoether, is delivered by direct liquid injection through a vaporizer. FIG. 6 shows very stable pressure responses, during pulsed vaporization of 0.3 M solution bis(2,2-dimethyl-5-(dimethylaminoethyl-imino)-3-hexanonato-N,O,N') strontium in 2,2'-oxybis(N,N-dimethylethanamine) in a DLI system, demonstrating the stability of the vaporization process during 150 hours of operation.

Several other formulations containing the same strontium precursor, but not containing aminoether type solvents demonstrated poor pressure responses and intermittent pressure spiking or clogging. For example, Sr formulations using mixed solvent systems, such as tetrahydrofuran ("THF") and dodecane, showed high static solubility, due to the addition of THF. However, during the vaporization process, the THF was vaporized early in the process and significant precipitation was accumulated within 6 hours of operation.

Furthermore, single ether type solvent systems, such as dipropylene glycol dimethylether, with the same strontium precursor, exhibited the same unacceptable result. In these tests, failures were observed due to lower solubility, as well as reactivity with the precursor during vaporization.

In contrast, the pressure stability profile observed in FIG. 6 for the 2,2'-oxybis(N,N-dimethylethanamine) solvent system was demonstrated over 150 hours.

After the initial testing, the injector system was inspected, and no evidence of reprecipitation was observed. In order to verify that the precursor did not form a gas phase complex with the system, the precursor was condensed downstream from the vaporizer. Comparison of TGA results showed that the precursor was unchanged from the starting material, and no evidence of complexation was found.

In another aspect of this invention, the liquid formulation comprising aminoether is employed for depositing a metal-containing film by CVD or ALD comprising contacting a substrate with the vapors obtained by vaporization of the liquid formulation under conditions suitable to deposit a metal-containing film. Suitable conditions to deposit a metal-containing film may include: decomposing of metalorganic precursor chemically, thermally, photochemically or by plasma activation. Deposition can be conducted in the presence of other gas components. In one embodiment of this invention, film deposition is conducted in the presence of at least one non-reactive carrier gas. Examples of non-reactive inert carrer gases include: nitrogen, agron, helium and others. In other embodiments, film deposition is conducted in the presence of at least one reactive gas.

Examples of reactive gases may includ, but are not limited to: oxygen, water vapor, ozone and others. In other embodiments, the liquid formulations of this invention are employed for depositing High K metal oxides films by ALD.

Figure 7:
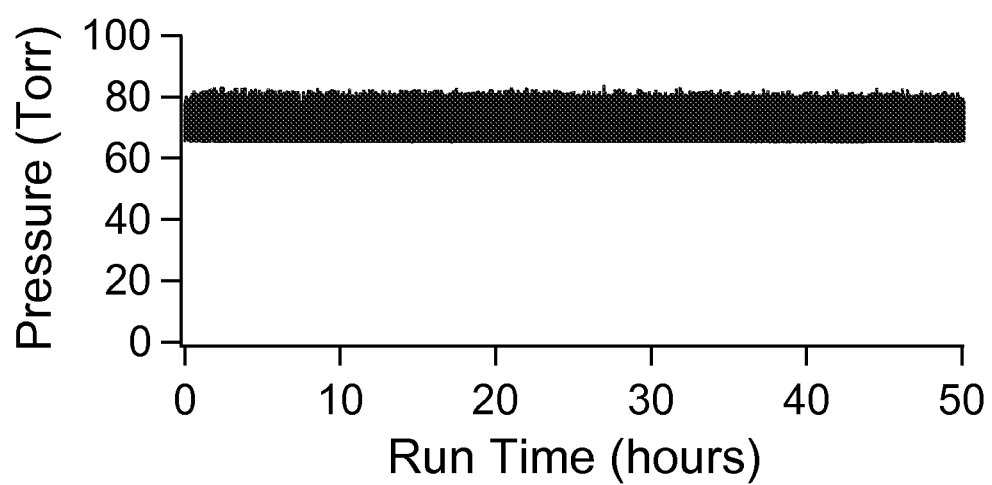
FIG. 7 shows pressure responses during pulsed vaporization of 0.05 M solution of barium bis(2,5-di-tert-butyl-pyrrolyl) in 2,2'-oxybis(N,N-dimethylethanamine) in a DLI system, demonstrating the stability of the vaporization process, after at least 54 hours of operation.
Figure 8:
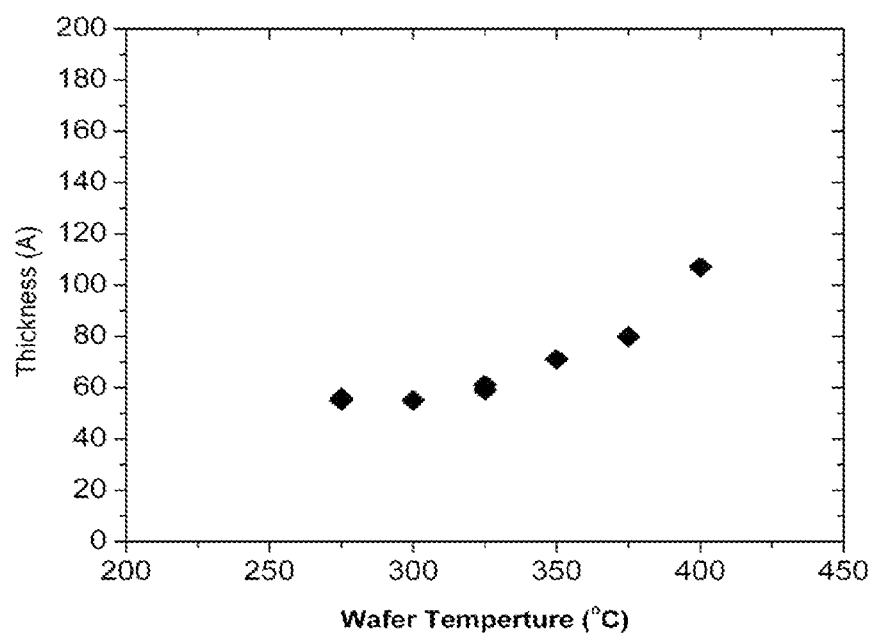
FIG. 8 is the temperature dependence of thermal ALD of depositing SrO using ozone and 0.3M bis(2,2-dimethyl-5-(dimethylaminoethyl-imino)-3-hexanonato-N,O,N') strontium dissolved in 2,2'-oxybis(N,N-dimethylethanamine).

FIG. 8 shows the temperature dependence of thermal ALD of depositing SrO using ozone and 0.3M bis(2,2-dimethyl-5-(dimethylaminoethyl-imino)-3-hexanonato-N,O,N')strontium dissolved in 2,2'-oxybis(N,N-dimethylethanamine). The ALD process window for this precursor/solvent formulation was up to 320° C. For ALD type processes, the self-limiting reactive nature of the precursor with the substrate surface primarily defines the deposition rate at a given temperature. Factors that can influence the deposition rate can include, but are not limited to: the steric bulk of the precursor, the reaction rate of the precursor with the substrate surface and the adsorption/desorption rates of the precursor on the substrate surface. During the deposition process, a change to the deposition rate could be used as an indicator for modifications to either the precursor or the substrate surface. If a precursor had coordinated or reacted with the solvent system, it would be expected that the deposition rate characteristics would be modified. In FIG. 7, the temperature dependence and depositon rate properties of the Sr precursor were found to be identical, between the DLI method described and the bubbling method, where the strontium precursor was delivered as a neat precursor with a bubbling configuration. This comparison provides evidence that the solvent system is benign to the deposition process.

The liquid compositions of the invention can be stored, shipped to the application site and delivered to DLI system by any number of means, preferably using a pressurizable stainless steel vessel fitted with the proper valves and fittings to allow the delivery of liquid to the DLI system.

COMPARATIVE EXAMPLE 1

Solubility of bis(2,2-dimethyl-5-(dimethylaminoethyl-imino)-3-hexanonato-N,O,N')strontium in dibutyl ether, high boiling point (bp) monoether To a 2 ml volume calibrated vial 0.127 g of bis(2,2-dimethyl-5-(dimethylaminoethyl-imino)-3-hexanonato-N,O,N') strontium (0.25 mmol) and dibutyl ether were added to form 1 ml of the mixture. The mixture was kept at room temperature overnight, but significant amount of insoluble solids were still present in the mixture indicating that solubility of this strontium complex in dibutyl ether is much less than 0.25 M.

COMPARATIVE EXAMPLE 2

Solubility of bis(2,2-dimethyl-5-(dimethylaminoethyl-imino)-3-hexanonato-N,O,N')strontium in N-methyl dicyclohexylamine (high by monoamine)

To a 2 ml volume calibrated vial, 0.127 g of bis(2,2-dimethyl-5-(dimethylaminoethyl-imino)-3-hexanonato-N,O,N')

strontium (0.25 mmol) and N-methyl dicyclohexylamine were added to form 1 ml of the mixture. The mixture was kept at room temperature overnight, but insoluble solids were still present. An excess of the solvent was added to increase mixture volume to 2 ml, but the material was still not completely dissolved, indicating that solubility of 2,2-dimethyl-5-(dimethylaminoethyl-imino)-3-hexanonato-N,O,N')strontium in N-methyl dicyclohexylamine (high by monoamine) is less than 0.12 M.

EXAMPLE 3

Solubility of bis(2,2-dimethyl-5-(dimethylaminoethyl-imino)-3-hexanonato-N,O,N')strontium in 2,2'-oxybis(N,N-dimethylethanamine) (high by aminoether)

A sample of 2,2'-oxybis(N,N-dimethylethanamine), containing 389 ppm of moisture, was dried overnight over activated 3 A molecular sieves to obtain a solvent containing less than 25 ppm of moisture. 0.381 g of bis(2,2-dimethyl-5-(dimethylaminoeihyl-imino)-3-hexanonato-N,O,N')strontium (0.75 mmol) was mixed with 0.580 g of 2,2'-oxybis(N,N-dimethylethanamine) to obtain 1 ml of clear, almost colorless solution. Thus, solubility of bis(2,2-dimethyl-5-(dimethylaminoethyl-imino)-3-hexanonato-N,O,N')strontium in 2,2'-oxybis(N,N-dimethylethanamine) is at least 0.75 M.

EXAMPLE 4

Thermal stability of the solution of bis(2,2-dimethyl-5-(dimethylaminoethyl-imino)-3-hexanonato-N,O,N')strontium in 2,2'-oxybis(N,N-dimethylethanamine)

0.75 M solution of bis(2,2-dimethyl-5-(dimethylaminoethyl-imino)-3-hexanonato-N,O,N')strontium in 2,2'-oxybis(N,N-dimethylethanamine) prepared, as described in Example 2, was transferred into a screw-cap NMR tube under nitrogen atmosphere. The sample was heated in the NMR tube for one hour at 160° C. No precipitate or significant discoloration was observed during heating. No changes were observed in the 1H NMR spectra of the solution before and alter heating, suggesting that the solution is thermally stable up to at least 160° C., see FIGS. 1 and 2.

EXAMPLE 5

Solubility of bis(2,2-dimethyl-5-(1-dimethylamino-2-propyl-imino)-3-hexanonato-N,O,N')strontium in 2,2'-oxybis(N,N-dimethylethanamine)

A sample of 2,2'-oxybis(N,N-dimethylethanamine), containing 389 ppm of moisture, was dried overnight over activated 3 A molecular sieves to obtain a solvent containing less than 25 ppm of moisture. 0.510 g of bis(2,2-dimethyl-5-(1-dimethylamino-2-propyl-imino)-3-hexanonato-N,O,N') strontium (0.95 mmol) was mixed with 0.516 g of 2,2'-oxybis(N,N-dimethylethanamine) to obtain 1 ml of clear, light yellow solution. Thus, solubility of bis(2,2-dimethyl-5-(1-dimethylamino-2-propyl-imino)-3-hexanonato-N,O,N') strontium in 2,2'-oxybis(N,N-dimethylethanamine) is at least 49.8 wt %, ~0.95 M.

EXAMPLE 6

TGA of 35 wt % solution of bis(2,2-dimethyl-5-(1-dimethylamino-2-propyl-imino)-3-hexanonato-N,O,N')strontium in 2,2'-oxybis(N,N-dimethylethanamine)

A sample of bis(2,2-dimethyl-5-(1-dimethylamino-2-propyl-imino)-3-hexanonato-N,O,N')strontium and its 35 wt % solution in 2,2'-oxybis(N,N-dimethylethanamine) were characterized by TGA (5 C/min to 300° C., isothermal at 300° C. for 0.5 hour). Very low residues were observed for the neat compound (0.61 wt %) and for its 35 wt % solution (0.71 wt %). The solvent was cleanly removed from the precursor, suggesting that this solution is a good candidate for DLI.

EXAMPLE 7

Characterization of bis(2,2-dimethyl-5-(dimethylaminoethyl-imino)-3-hexanonato-N,O,N')strontium in 2,2'-oxybis(N,N-dimethylethanamine)

A sample of 40 wt % solution of bis(2,2-dimethyl-5-(dimethylaminoethyl-imino)-3-hexanonato-N,O,N')strontium in 2,2'-oxybis(N,N-dimethylethanamine) (~0.7 M) was characterized by TGA (10° C./min to 400° C.), and very low residue was observed (0.42 wt %). The solvent was cleanly removed from the precursor,.suggesting that this solution is a good candidate for DLI.

EXAMPLE 8

Solubility of bis(2,2-dimethyl-5-(dimethylaminoethyl-imino)-3-hexanonato-N,O,N')strontium in 4-[2-(dimethylamino)ethyl]morpholine Sample of 4-[2-(dimethylamino)ethyl]morpholine, containing 2990 ppm of moisture, was dried over activated 3 A molecular sieves to obtain solvent containing less than 100 ppm of moisture. 0.502 g of bis(2,2-dimethyl-5-(dimethylaminoethyl-imino)-3-hexanonato-N,O,N')strontium (0.99 mmol) was mixed with 0.608 g of 4-[2-(dimethylamino)ethyl]morpholine to obtain ~1 ml of the mixture, containing a small amount of insoluble material. Extra solvent was added in small portions (0.05 g) until all material was dissolved. Total weight of clear, colorless solution was 1.35 g, ~1.25 ml, indicating that solubility of bis(2,2-dimethyl-5-(dimethylaminoethyl-imino)-3-hexanonato-N,O,N')strontium in 4-[2-(dimethylamino)ethyl]morpholine is 37.2 wt % or 0.8 M.

EXAMPLE 9

Solubility of bis(2,2-dimethyl-5-(1-dimethylamino-2-propyl-imino)-3-hexanonato-N,O,N')strontium in 4-[2-(dimethylamino)ethyl]morpholine A sample of 4-[2-(dimethylamino)ethyl]morpholine, containing 2990 ppm of moisture, was dried over activated 3 A molecular sieves to obtain solvent containing less than 100 ppm of moisture. 0.595 g of bis(2,2-dimethyl-5-(1-dimethylamino-2-propyl-imino)-3-hexanonato-N,O,N')strontium (1.1 mmol) was mixed with 0.500 g of 4-[2-(dimethylamino)ethyl]morpholine to obtain ~1 ml of the clear, light yellow solution. Thus, solubility of 2,2-dimethyl-5-(1-dimethylamino-2-propyl-imino)-3-hexanonato-N,O,N')strontium in 4-[2-(dimethylamino)ethyl]morpholine is at least 54.5 wt % or ~1.1 M.

EXAMPLE 10

Solubility of bis(2,2-dimethyl-5-(dimethylaminoethyl-imino)-3-hexanonato-N,O,N')bis(tert-butoxy) titanium in 2,2'-oxybis(N,N-dimethylethanamine)

1.02 g of bis(2,2-dimethyl-5-(dimethylaminoethyl-imino)-3-hexanonato-N,O,N')bis(tert-butoxy)titanium was mixed with 1.01 g of 2,2'-oxybis(N,N-dimethylethanamine) to result in 2.22 ml of a greenish brown solution. Thus, solubility of 2,2-dimethyl-5-(dimethylaminoethyl-imino)-3-hexanonato-N,O,N')strontium in 2,2'-oxybis(N,N-dimethylethanamine) is at least 1 M.

EXAMPLE 11

Solubility of bis(2,2-dimethyl-5-(dimethylaminoethyl-imino)-3-hexanonato-N,O,N')bis(iso-propoxy) titanium in 2,2'-oxybis(N,N-dimethylethanamine)

1.05 g of bis(2,2-dimethyl-5-(dimethylaminoethyl-imino)-3-hexanonato-N,O,N')bis(iso-propoxy)titanium was mixed with 0.90 g of 2,2'-oxybis(N,N-dimethylethanamine) to result in 2.12 ml of a greenish brown solution. Thus, solubility of 2,2-dimethyl-5-(dimethylaminoethyl-imino)-3-hexanonato-N,O,N')strontium in 2,2'-oxybis(N,N-dimethylethanamine) is at least 1.1 M.

EXAMPLE 12

Solubility of tetrakis(2,2,6,6-tetramethyl-3,5-heptanedionato)cerium (IV) in 2,2'-oxybis(N,N-dimethylethanamine)

0.50 g (0.72 mmol) of tetrakis(2,2,6,6-tetramethyl-3,5-heptanedionato)cerium (IV) Was dissolved in 16.2 g (101 mmol) of 2,2'-oxybis(N,N-dimethylethanamine) to make a 3% wt solution.

EXAMPLE 13

Solubility of tris(2,2,6,6-tetramethyl-3,5-heptanedionato)lanthanum in 2,2'-oxybis(N,N-dimethylethanamine)

0.50 g (0.72 mmol) of tris(2,2,6,6-tetramethyl-3,5-heptanedionato)lanthanum was dissolved in 4.0 g (25 mmol) of 2,2'-oxybis(N,N-dimethylethanamine) to make a 11% wt solution.

EXAMPLE 14

Solubility of Sr($^t$Bu$_3$Cp)$_2$ in 2,2'-oxybis(N,N-dimethylethanamine)

0.50 g (0.90 mmol) of Sr($^t$Bu$_3$Cp]$_2$ was dissolved in 5.0 g (31.25 mmol) of 2,2'-oxybis(N,N-dimethylethanamine) to make a 9% wt solution of Sr[(tBu)$_3$Cp]$_2$.

EXAMPLE 15

Solubility of Ba($^t$Bu)$_3$Cp)$_2$ in 2,2'-oxybis(N,N-dimethylethanamine)

0.50 g (0.83 mmol) of Ba($^t$Bu$_3$Cp)$_2$ was dissolved in 5.0 g (31.25 mmol) of 2,2'-oxybis(N,N-dimethylethanamine) to make a 9% wt solution of Ba[(tBu)$_3$Cp]$_2$.

EXAMPLE 16

Solubility of La(MeCp)$_3$ in 2,2'-oxybis(N,N-dimethylethanamine)

0.20 g (0.83 mmol) of La(MeCp)$_3$ was dissolved in 3.3 g (20.6 mmol) of 2,2'-oxybis(N,N-dimethylethanamine) to make a 6% wt solution of La(MeCp)$_3$

EXAMPLE 17

Viscosity of 0.6 M solution of bis(2,2-dimethyl-5-(dimethylaminoethyl-imino)-3-hexanonato-N,O,N') strontium in 2,2'-oxybis(N,N-dimethylethanamine)

Viscosity was measured using an AR-G2 rheometer (TA Instruments, New Castle, Del.). Temperature was controlled at desired temperature using a Peltier heating element. A 60 mm diameter parallel plate geometry was used., After sample loading, 600 sec was allowed for thermal equilibration before shear rate sweep measurement. Viscosities were measured at shear rates ranging from 1 to 200 s$^{-1}$. Data points at low shear rates (<6 s$^{-1}$) are considered less reliable and are not reported here. Viscosity results were compiledin Table 3. All reported viscosities are in units of 36 centipoises (1 cP=0.01 P=1 mPa s). It was found that a 0.6 M solution of bis(2,2-dimethyl-5-(dimethylaminoethyl-imino)-3-hexanonato-N,O,N')strontiumin 2,2'-oxybis(N,N-dimethylethanamine)is shear thinning with viscosity less than 10 centipoise.

TABLE 3

| Temperature, 25° C. | |
| --- | --- |
| Shear Rate, s$^{-1}$ | Viscosity (cP) |
| 6.3 | 5.58 |
| 10 | 5.27 |
| 16 | 5.03 |
| 25 | 4.80 |
| 40 | 4.59 |
| 63 | 4.42 |
| 100 | 4.29 |
| 158 | 4.23 |
| 200 | 4.21 |

EXAMPLE 18

Preparation of an adduct of Sr($^t$Bu$_3$Cp)$_2$ with 2,2'-oxybis(N,N-dimethylethanamine)

To a foggy solution of 0.65 g (1.18 mmol) Sr($^t$Bu$_3$Cp)$_2$ in hexane at room temperature was added 0.19 g (1.18 mmol) of 2,2'-oxybis(N,N-dimethylethanamine). The reaction mixture was stirred for several hours, after which all volatiles (including solvents) were removed under vacuum, and 0.74 g of an off-white waxy solid was isolated.

$^1$H NMR (500 MHz, C$_6$D$_6$): δ=5.96 (s, 4H), 3.46 (t, 4H), 2.46 (t, 4H), 2.15 (s, 12H), 1.44 (s, 36H), 1.39 (s, 18H).

EXAMPLE 19

Preparation of an adduct of Ba(tBu$_3$Cp)$_2$ with 2,2'-oxybis(N,N-dimethylethanamine)

To a foggy solution of 0.12 g (0.20 mmol) Ba(tBu$_3$Cp)$_2$ in hexane at room temperature was added 0.03 g (0.20 mmol) of 2,2'-oxybis(N,N-dimethylethanamine). The reaction mixture was stirred for several hours, after which all volatiles (including solvents) were removed under vacuum and 0.15 g of an off-white waxy solid was isolated.

$^1$H NMR (500 MHz, $C_6D_6$): δ=5.96 (s, 4H), 3.46 (t, 4H), 2.46 (t, 4H), 2.15 (s, 12H), 1.44 (s, 36H), 1.39 (s, 18H).

EXAMPLE 20

Preparation of an adduct of zirconium tert-butoxide with 2,2'-oxybis(N,N-dimethylethanamine)

To a solution of 0.56 g (1.46 mmol) $Zr(^tBuO)_4$ in hexane at room temperature was added 0.23 g (1.46 mmol) 2,2'-oxybis(N,N-dimethylethanamine). The reaction mixture was stirred for several hours, after which upon removal of volatiles (including solvents), crystals began to form. Before all volatiles were removed, the mixture was heated to a homogenous solution and allowed to recrystallize at −40° C. Crystals were characterized as desired $Zr(^tBuO)_4.(NMe_2CH_2CH_2)_2O$ adduct by x-ray analysis.

EXAMPLE 21

Synthesis of bis(2-tert-butyl-4,5-di-tert-amylimidazolyl)(2,2'-oxybis(N,N-dimethylethylamine)strontium Under a blanket of nitrogen, 2.75 g (0.005 moles) of strontium bis(hexamethyldisilylamide)bis(tetrahydrofuran) dissolved in 20 ml of dry hexane were added dropwise over a five minute period at room temperature to a mixture of 2.68 g (0.01 moles) of 2-tert-butyl-4,5-di-tert-amylimidazole and 0.80 g (0.005 moles) of 2,2'-oxybis(N,N-dimethylethylamine) dissolved in 40 ml of dry hexane. Within 30 minutes, a white precipitate was observed to form, but this slowly dissolved to give a faintly turbid solution, which was then stirred overnight. After overnight stirring, a second precipitate was observed to have formed. 60 ml of additional hexane was then added, and the mixture refluxed to dissolve the precipitate. This solution was then filtered, and the filtrate slowly cooled to −5° C. over a 2 hour period, whereupon the crystalline product was filtered off. Yield 3.25 g (43% of theoretical).

EXAMPLE 22

Direct liquid injection performance of bis(2,2-dimethyl-5-(dimethylamino-ethylimino)-3-hexanonato-N,O,N')strontium in 2,2'-oxybis(N,N-dimethylethanamine)

0.3 M solution of bis(2,2-dimethyl-5-(dimethylamino-ethylimino)-3-hexanonato-N,O,N')strontium in 2,2'-oxybis(N,N-dimethylethanamine) was pulsed into a heated injection liquid vaporization system for 150 hours of consecutive running. Pulsing into the injection system was controlled by a liquid flow controller with 10 s of liquid flow (0.3 gpm), followed by 30 s of stopped flow. Continuous pulsing was performed for 150 hours. The strontium precursor was condensed downstream from the injector and analyzed for purity. TGA results for the precursor compared well with the initial precursor residue levels and volatility, demonstrating that there was no evidence of precursor degradation. FIG. 6 shows an example of pressure responses during liquid run times, demonstrating the stability of the vaporization process. Prior testing for solvent/precursor systems that had incompatibilities demonstrated poor pressure responses and intermittent pressure spiking or clogging.

EXAMPLE 23

Direct liquid injection performance of bis(2,2-dimethyl-5-(1-dimethylamino-2-propyl-imino)-3-hexanonato-N,O,N')strontium in 2,2'-oxybis(N,N-dimethylethanamine)

0.3M solution of bis(2,2-dimethyl-5-(1-dimethylamino-2-propyl-imino)-3-hexanonato-N,O,N')strontium in 2,2'-oxybis(N,N-dimethylethanamine) was pulsed into a heated injection liquid vaporization system for 150 hours of consecutive running. Pulsing into the injection system was controlled by a liquid flow controller with 10 s of liquid flow (0.3 gpm), followed by 30 s of stopped flow. Continuous pulsing was performed for 150 hours, the strontium precursor was condensed downstream from the injector and analyzed for purity. TGA results for the precursor compared well with the initial precursor residues levels and volatility, demonstrating that there was no evidence of precursor degradation. Prior testing for solvent/precursor systems that had incompatibilities demonstrated poor pressure responses and intermittent pressure spiking or clogging.

EXAMPLE 24

Direct liquid injection performance of bis(2,5-di-tert-butyl-pyrrolyl)barium in 2,2'-oxybis(N,N-dimethylethanamine)

0.05M solution of bis(2,5-di-tert-butyl-pyrrolyl)barium in 2,2'-oxybis(N,N-dimethylethanamine) was pulsed into a heated injection liquid vaporization system for 50 hours of consecutive running. Pulsing into the injection system was controlled by a liquid flow controller with 10 s of liquid flow (0.3 gpm), followed by 30 s of stopped flow. Continuous pulsing was performed for 50 hours, the barium precursor was condensed downstream from the injector and analyzed for purity. TGA results for the precursor compared well with the initial precursor residues levels and volatility, demonstrating that there was no evidence of precursor degradation. Prior testing for solvent/precursor systems that had incompatibilities demonstrated poor pressure responses and intermittent pressure spiking or clogging.

EXAMPLE 25

ALD deposition of SrO using bis(2,2-dimethyl-5-(1-dimethylamino-2-propyl-imino)-3-hexanonato-N,O,N')strontium dissolved in 2,2'-oxybis(N,N-dimethylethanamine)

This example describes a typical ALD deposition of SrO using ozone and Sr ketoiminate precursor, bis(2,2-dimethyl-5-(1-dimethylamino-2-propyl-imino)-3-hexanonato-N,O,N')strontium dissolved in 2,2'-oxybis(N,N-dimethylethanamine). The deposition temperature range is 250-450° C., and a DLI (direct liquid injection), with a vaporizor used to deliver the Sr precursor. The deposition chamber pressure ranges around 1.5 Torr, depending upon the gas flow rates. The dip tube side of the canister, containing the solution of Sr precursor in 2,2'-oxybis(N,N-dimethylethanamine) is connected to a DLI vaporizer, and the solution was injected into the vaporizer to convert to vapors. One cycle of the ALD of SrO consists of 4 steps:

1. Injection of a 0.3M solution of Sr precursor into the vaporizer and introduction of Sr precursor vapor to the deposition chamber; and Sr precursor chemically sorbed on the heated substrate;
2. Ar purge: purging away any unsorbed Sr precursor with Ar;
3. Ozone pulse: introducing ozone into the deposition chamber to react with sorbed Sr precursor on the heated substrate; and,
4. Ar purge: purging away any unreacted ozone and by-products with Ar.

In this example, SrO films were deposited, showing a deposition temperature dependence of the SrO film. The injection was 5 seconds, the Ar purge time after Sr pulse was 10 seconds, the ozone pulse time was 5 seconds, and the Ar purge time after ozone pulse was 10 seconds. This was repeated for 100 cycles.

The results are depicted in FIG. 8, in which the ALD process window was up to an average of ~320° C.

The invention claimed is:

1. A formulation, comprising:
   a) at least one metal-ligand complex, wherein one or more ligands are selected from the group consisting of, β-diketonate, β-ketoiminate, β-ketoesterate, β-diiminate, alkyl, carbonyl, alkyl carbonyl, cyclopentadienyl, pyrrolyl, alkoxide, amidinate, imidazolyl, and mixtures thereof; and the metal is selected from Group 2 to 16 elements of the Periodic Table of the Elements; and,
   b) at least one aminoether solvent selected from the group consisting of $R^1R^2NR^3OR^4NR^5R^6$, $R^1OR^4NR^5R^6$, $O(CH_2C_2)_2NR^1$, $R^1R^2NR^3N(CH_2CH_2)_2O$, $R^1R^2NR^3OR^4N(CH_2CH_2)_2O$, $O(CH_2CH_2)_2NR^3OR^4N(CH_2CH_2)_2O$, and mixtures thereof, wherein $R^{1-2}$ and $R^{5-6}$ are independently selected from group consisting of $C_{1-10}$ linear alkyl, $C_{1-10}$ branched alkyl, $C_{1-10}$ cyclic alkyl, $C_6-C_{10}$ aromatic, $C_{1-10}$ alkylamine, $C_{1-10}$ alkylaminoalkyl, $C_{1-10}$ ether, $C_4-C_{10}$ cyclic ether, $C_4-C_{10}$ cyclic aminoether, and mixture thereof; and $R^{3-4}$ are independently selected from group consisting of $C_{1-10}$ linear alkylene, $C_{1-10}$ branched alkylene, $C_{1-10}$ cyclic alkylene, $C_6-C_{10}$ aromatic, $C_{1-10}$ alkylamine, $C_{1-10}$ alkylaminoalkyl, $C_{1-10}$ ether, $C_4-C_{10}$ cyclic ether, $C_4-C_{10}$ cyclic aminoether, and mixture thereof.

2. The formulation of claim 1 wherein the one or more ligands of the metal-ligand complex are monodentate, bidentate, multidentate and mixtures thereof.

3. The formulation of claim 1 wherein the formulation comprises aminoethers with a general formula of: $R^1R^2NR^3OR^4NR^5R^6$, wherein $R^{1-2}$ and $R^{5-6}$ are independently selected from group consisting of $C_{1-10}$ linear alkyl, $C_{1-10}$ branched alkyl, $C_{1-10}$ cyclic alkyl, $C_6-C_{10}$ aromatic; and $R^{3-4}$ are independently selected from group consisting of $C_{1-10}$ linear alkylene, $C_{1-10}$ branched alkylene, $C_{1-10}$ cyclic alkylene, $C_6-C_{10}$ aromatic, $C_{1-10}$ alkylamine, $C_{1-10}$ alkylaminoalkyl, $C_{1-10}$ ether, $C_4-C_{10}$ cyclic ether, $C_4-C_{10}$ cyclic aminoether, and mixture thereof.

4. The formulation of claim 1 wherein the aminoether is selected from the group consisting of:

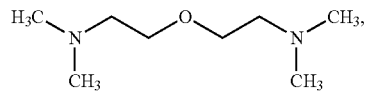

2,2'-oxybis(N,N-dimethylethanamine)

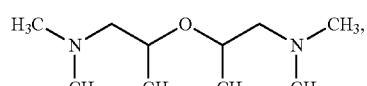

2,2'-oxybis(N,N-dimethylpropan-1-amine)

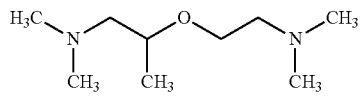

2-[2-(dimethylamino)ethoxy]-N,N-dimethylpropan-1-amine

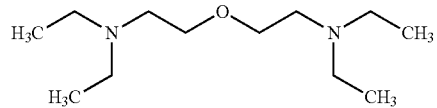

2,2'-oxybis(N,N-diethylethanamine)

N,N-dimethyl hexyloxypropylamine

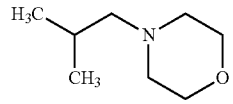

4-isobutylmorpholine

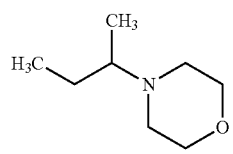

4-sec-butylmorpholine

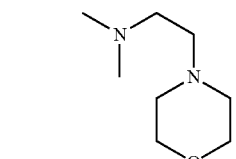

4-[2-(dimethylamino)ethyl]morpholine

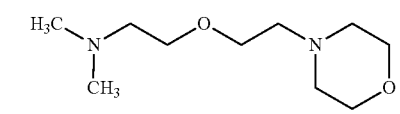

N,N-dimethyl-2-(2-morpholin-4-ylethoxy)ethanamine

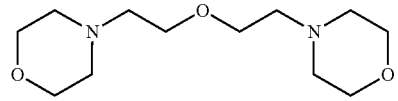

4,4'-(oxydiethane-2,1-diyl)dimorpholine and mixtures thereof.

5. The formulation of claim 3 wherein the metal-ligand complex is selected from the group consisting of:
(a) metal β-diketonates having the formula:

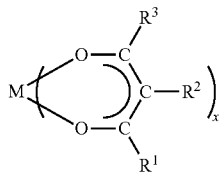

wherein M is selected from Group 2 to 16 metals, $R^{1-3}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ fluorinated alkyl; and x=2, 3, or 4;

(b) metal β-ketoiminates having the formula:

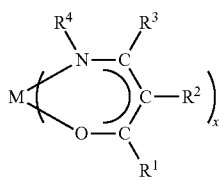

wherein M is selected from Group 2 to 16 metals, $R^{1-4}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; and x=2, 3, 4;

(c) metal β-diiminates having the formula:

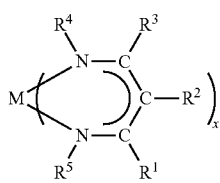

wherein M is selected from Group 2 to 16 metal, $R^{1-5}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; and x=2, 3, 4;

(d) metal β-ketoiminates having the formula:

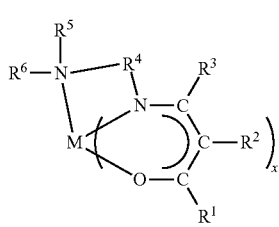

wherein M is selected from Group 2 to 16 metal; $R^{1-6}$ and $R^{5-6}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^4$ is selected from group consisting of hydrogen, $C_{1-10}$ linear or branched alkylene, $C_{1-10}$ linear or branched alkoxy, $C_{4-10}$ cycloaliphatic, $C_{6-10}$ aryl, and $C_{1-10}$ linear or branched fluorinated alkylene; and x=2,3;

(e) metal β-ketoiminates having the formula:

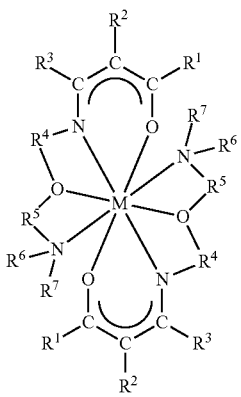

wherein M is an alkaline earth metal selected from Group 2; $R^1$ is a branched alkyl group containing 4 to 10 carbon atoms; $R^2$ is selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^3$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^{4-5}$ are individually selected from the group consisting of $C_{1-10}$ linear or branched alkylene, $C_{1-10}$ linear or branched alkoxy, $C_{4-10}$ cycloaliphatic, $C_{6-10}$ aryl, and $C_{1-10}$ linear or branched fluorinated alkylene; $R^{6-7}$ are individually selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl and a ring containing carbon, oxygen, or nitrogen atoms;

(f) metal β-ketoiminates having the formula:

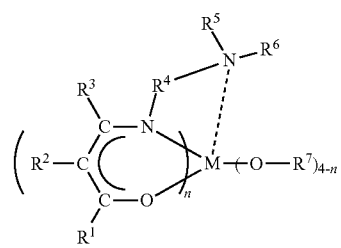

wherein M is a metal ion selected from Group 4 metals; wherein $R^1$ is a branched alkyl group containing 4 to 10 carbon atoms; $R^2$ can be individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^3$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^4$ is selected from group consisting of $C_{1-10}$ linear or branched alkylene, $C_{1-10}$ linear or branched alkoxy, $C_{4-10}$ cycloaliphatic, $C_{6-10}$ aryl, and $C_{1-10}$ linear or branched fluorinated alkylene; $R^{5-6}$ are individually selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; and a ring containing carbon, oxygen, or nitrogen atoms; $R^7$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; and n=1,2,3;

(g) metal β-ketoiminates having the formula:

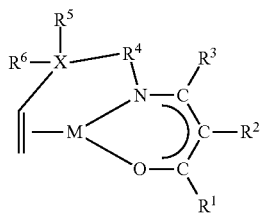

wherein M is a metal ion selected from Group 11; $R^1$ is a branched alkyl group containing 1 to 10 carbon atoms; $R^2$ is selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^3$ is selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; $R^4$ is selected from groups consisting of $C_{1-10}$ linear or branched alkylene, $C_{1-10}$ linear or branched alkoxy, $C_{4-10}$ cycloaliphatic, $C_{6-10}$ aryl, and $C_{1-10}$ linear or branched fluorinated alkylene; $R^{5-6}$ are individually selected from the group consisting of $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl, and a ring containing carbon, oxygen, or nitrogen atoms; X is carbon or silicon; 7

(h) metal complex having the formula:

wherein M is selected from Group 2 to 16 metals, wherein R is selected from the group consisting of hydrogen, $C_{1-10}$ linear, branched, saturated or unsaturated alkyl, $C_{1-10}$ linear or branched alkoxy, $C_{4-10}$ cycloaliphatic, $C_{6-10}$ aryl, and $C_{1-10}$ linear or branched fluorinated alkyl, cyclopentadienyl, alkyl substituted cyclopentadienyl, pyrollyl, alkyl substituted pyrollyl, imidazolyl, alkyl substituted imidazolyl and their derivatives; wherein x=2, 3, 4; L is a neutral or mono anion donor ligand containing oxygen or nitrogen atoms; and n=0, 1, 2, 3, 4;

(i) alkyl metal carbonyls having the formula:

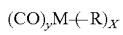

wherein M is selected from Group 2 to 16 metals; R is selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl, cyclopendienyl and their derivatives; x=2, 3, 4; and y=1, 2, 3, or 4;

(j) metal carbonyls having the formula:

wherein M is selected from Group 8 to 10 metal; x=1, 2, 3; and y=4 to 12;

(k) metal alkoxides having the formula:

wherein M is selected from Group 2 to 16 metal; R is selected from the group consisting of $C_{1-10}$ alkyl, $C_{1-10}$ alkenyl, $C_{1-10}$ alkynyl, $C_5$-$C_{10}$ cycloaliphatic, $C_{6-12}$ aryl, and fluorinated $C_{1-10}$ alkyl; and n is 2, 3, 4 or 5;

(l) metal amides having the formula:

wherein M is selected from Group 2 to 16 metal; $R^{1-2}$ are independently selected from the group consisting of $C_{1-10}$ linear or branched alkyl, $C_{1-10}$ linear or branched alkenyl, $C_{1-10}$ linear or branched alkynyl, $C_{3-10}$ linear or branched alkylsilyl, $C_5$-$C_{10}$ cycloaliphatic, $C_{6-12}$ aryl, and linear or branched fluorinated $C_{1-10}$ alkyl; and n is 2, 3, 4, or 5;

(m) metal alkoxy β-diketonates having the formula:

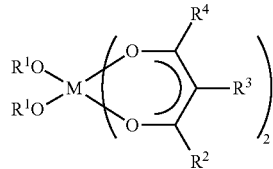

wherein M comprises a metal selected from the group consisting of Ti, Zr, and Hf; $R^1$ is an alkyl group comprising from 1 to 10 carbon atoms; $R^2$ is an alkyl group comprising from 1 to 10 carbon atoms; $R^3$ is selected from the group consisting of hydrogen and an alkyl group comprising from 1 to 3 carbon atoms; and $R^4$ is an alkyl group comprising from 1 to 6 carbon atoms;

(n) metal amidinates having the formula:

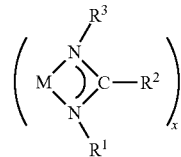

wherein M is selected from Group 2 to 16 metals, wherein $R^{1-3}$ are individually selected from the group consisting of hydrogen, $C_{1-10}$ linear or branched alkyl, $C_{1-10}$ linear or branched alkoxy, $C_{4-10}$ cycloaliphatic, $C_{6-10}$ aryl, and $C_{1-10}$ linear or branched fluorinated alkyl; wherein x=2, 3, 4; and mixtures thereof.

6. The formulation of claim 1 wherein the aminoether is selected from the group consisting of 2,2'-oxybis(N,N-dimethylethanamine), 4-[2-(dimethylamino)ethyl]morpholine, and mixtures thereof.

7. The formulation of claim 6 wherein the aminoether is 2,2'-oxybis(N,N-dimethylethanamine) having less than 20 ppm of water.

8. The formulation of claim 6 wherein the aminoether is 2,2'-oxybis(N,N-dimethylethanamine) having less than 100 ppm of additional compounds containing hydroxyl or amine functionality.

9. A liquid formulation useful for deposition of metal-containing thin films in making semiconductor devices, comprising;

a) at least one metal-ligand complex selected from the group consisting of bis(2,2-dimethyl-5-(dimethylaminoethyl-imino)-3-hexanonato-N,O,N')strontium, bis(2,2-dimethyl-5-(1-dimethylamino-2-propylimino)-3-hexanonato-N,O,N')strontium, bis(2,2-dimethyl-5-(dimethylaminoethyl-imino)-3-hexanonato-N,O,N')bis(tertbutoxy)titanium, tetrakis(2,2,6,6-tetramethyl-3,5-heptanedionato)cerium (IV), tris(2,2,6,6tetramethyl-3,5-heptanedionato)lanthanum, Sr($^t$Bu$_3$Cp)$_2$, Ba($^t$Bu$_3$Cp)$_2$, Sr($^i$Pr$_3$Cp)$_2$, Ba($^i$Pr$_3$Cp)$_2$, LaCp$_3$, La(MeCp)$_3$, La(EtCp)$_3$, La($^i$PrCp)$_3$, zirconium tert butoxide, bis(2-tert-butyl-4,5-di-tert-amylimidazolyl)strontium, bis(2-tert-butyl-4,5-di-tert amylimidazolyl)barium, bis(2,5-di-tert-butyl-pyrrolyl)strontium, bis(2,5-di-tert-butyl-pyrrolyl)barium, Ru(EtCp)$_2$, Ru(EtCp)(DMPD) and mixtures thereof; and, b) at least one aminoether selected from the group consisting of 2,2'-oxybis(N,N-dimethylethanamine), 4-[2-(dimethylamino)ethyl]morpholine, and mixtures thereof.

10. The formulation of claim 1 comprising bis(2,2-dimethyl-5-(dimethylaminoethyl-imino)-3-hexanonato-N,O,N') strontium and 2,2'-oxybis(N,N-dimethylethanamine).

11. A process for depositing a metal-containing film by chemical vapor deposition or atomic layer deposition comprising contacting a substrate under conditions to deposit a metal-containing film from a formulation of claim 1 and depositing such metal-containing film.

12. A process for depositing a metal-containing film by chemical vapor deposition or atomic layer deposition comprising contacting a substrate under conditions to deposit a metal-containing film from a formulation of claim 4 and depositing such metal-containing film.

13. A process for depositing a metal-containing film by chemical vapor deposition or atomic layer deposition comprising contacting a substrate under conditions to deposit a metal-containing film from a formulation of claim 5 and depositing such metal-containing film.

14. The process of claim 11 wherein the formulation is delivered by direct liquid injection through a vaporizer.

* * * * *